US011230134B2

(12) United States Patent
Zhu et al.

(10) Patent No.: US 11,230,134 B2
(45) Date of Patent: Jan. 25, 2022

(54) ELECTROHYDRODYNAMIC PRINTING OF NANOMATERIALS FOR FLEXIBLE AND STRETCHABLE ELECTRONICS

(71) Applicant: North Carolina State University, Raleigh, NC (US)

(72) Inventors: Yong Zhu, Raleigh, NC (US); Jingyan Dong, Raleigh, NC (US); Zheng Cui, Raleigh, NC (US); Yiwei Han, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 106 days.

(21) Appl. No.: 16/792,967

(22) Filed: Feb. 18, 2020

(65) Prior Publication Data

US 2020/0262230 A1    Aug. 20, 2020

Related U.S. Application Data

(60) Provisional application No. 62/807,012, filed on Feb. 18, 2019.

(51) Int. Cl.
*C09D 11/52* (2014.01)
*B41M 7/00* (2006.01)
(Continued)

(52) U.S. Cl.
CPC .............. *B41M 7/0081* (2013.01); *B41J 2/03* (2013.01); *B41M 7/009* (2013.01); *C08K 3/08* (2013.01);
(Continued)

(58) Field of Classification Search
CPC ..... B41J 2/005; B41J 2/03; C08K 2003/0806; C08K 2003/0812; C08K 2003/0831;
(Continued)

(56) References Cited

U.S. PATENT DOCUMENTS 8,562,095 B2 * 10/2013 Alleyne .................. B41J 2/125
347/14
2011/0170225 A1    7/2011 Rogers et al.
(Continued)

FOREIGN PATENT DOCUMENTS

KR           101519906 B1    5/2015

OTHER PUBLICATIONS

L. Hu, H. S. Kim, J.-Y. Lee, P. Peumans and Y. Cui, "Scalable Coating and Properties of Transparent, Flexible, Silver Nanowire Eletrodes," ACS Nano, 2010, 4, 2955-2963.
(Continued)

*Primary Examiner* — Mark Kopec
*Assistant Examiner* — Jaison P Thomas
(74) *Attorney, Agent, or Firm* — Thomas | Horstemeyer, LLP

(57) ABSTRACT

Disclosed are examples for printing a one-dimensional (1D) nanomaterial for use in stretchable electronic devices. An ink comprising a nanomaterial solution is dispersed from a pneumatic dispensing system of a printing device. The 1D nanomaterial is printed in a predefined pattern on an underlying substrate positioned on a ground electrode. A voltage is applied between the printing nozzle and the ground electrode to cause the ink to form into a cone during the printing. The substrate can be modified to increase the wettability of the substrate to enhance adhesion of the ink to the substrate.

20 Claims, 28 Drawing Sheets

(51) Int. Cl.
*B41J 2/03* (2006.01)
*C08K 3/08* (2006.01)

(52) U.S. Cl.
CPC ........ *C09D 11/52* (2013.01); *C08K 2003/085* (2013.01); *C08K 2003/0806* (2013.01); *C08K 2003/0812* (2013.01); *C08K 2003/0831* (2013.01); *C08K 2003/0862* (2013.01)

(58) Field of Classification Search
CPC ...... C08K 2003/085; C08K 2003/0862; C08K 3/08; C09D 11/102; C09D 11/52
See application file for complete search history.

(56) References Cited

U.S. PATENT DOCUMENTS

| | | | | |
|---|---|---|---|---|
| 2011/0187798 | A1* | 8/2011 | Rogers | B41J 2/06 347/55 |
| 2014/0138133 | A1* | 5/2014 | Byun | H05K 1/097 174/257 |
| 2014/0158399 | A1* | 6/2014 | Ulmer | H05K 3/225 174/250 |
| 2016/0029475 | A1* | 1/2016 | Hwang | H05K 3/125 174/254 |
| 2018/0032169 | A1* | 2/2018 | Kwak | G06F 3/0446 |
| 2019/0002719 | A1* | 1/2019 | Pousthomis | C09D 11/36 |
| 2020/0331270 | A1* | 10/2020 | Byun | B41J 2/06 |

OTHER PUBLICATIONS

S. De, T. M. Higgins, P. E. Lyons, E. M. Doherty, P. N. Nirmalraj, W. J. Blau, J. J. Boland and J. N. Coleman, "Silver Nanowire Networks as Flexible, Transparent, Conducting Films: Extremely High DC to Optical Conductivity Ratios", ACS Nano, 2009, 3, 1767-1774.
Z. Yu, Q. Zhang, L. Li, Q. Chen, X. Niu, J. Liu and Q. Pei, "Highly Flexible Silver Nanowire Electrodes for Shape-Memory Polymer Ligh-Emitting Diodes", Adv. Mater., 2011, 23, 664-668.
F. Xu and Y. Zhu, "Highly Conductive and Stretchable Silver Nanowire Conductors", Adv. Mater., 2012, 24, 5117-5122.
P. Lee, J. Lee, H. Lee, J. Yeo, S. Hong, K. H. Nam, D. Lee, S. S. Lee and S. H. Ko, "Highly Stretchable and Highly Conductive Metal Electrode by Very Long Metal Nanowire Percolation Network", Adv. Mater., 2012, 24, 3326-3332.
S. Gong, W. Schwalb, Y. Wang, Y. Chen, Y. Tang, J. Si, B. Shirinzadeh and W. Cheng, "A wearable and Highly Sensitive Pressure Sensor with Ultrathin Gold Nanowires", Nat. Commun., 2014, 5, 3132.
S. Yao and Y. Zhu, "Nanomaterial-Enabled Stretchable Conductors: Strategies, Materials and Devices," Adv. Mater., 2015, 27, 1480-1511.
I. Chang, T. Park, J. Lee, M. H. Lee, S. H. Ko and S. W. Cha, J., "Bendable Polymer Electrolyte Fuel Cell Using Highly Flexible Ag Nanowire Percolation Network Current Collectors", Mater. Chem. A, 2013, 1, 8541-8546.
K. K. Kim, S. Hong, H. M. Cho, J. Lee, Y. D. Suh, J. Ham and S. H. Ko, Highly Sensitive and Stretchable Multidimensional Strain Sensor with Prestrained Anisotropic Metal Nanowire Percolation Networks, Nano Lett., 2015, 15, 5240-5247.
Q. Zhang, Y. Di, C. M. Huard, L. J. Guo, J. Wei and J. Guo, J., "Highly Stable and Stretchable Graphene—Polymer Processed Silver Nanowires Hybrid Electrodes for Flexible Displays", Mater. Chem. C, 2015, 3, 1528-1536.
J. Lee, K. An, P. Won, Y. Ka, H. Hwang, H. Moon, Y. Kwon, S. Hong, C. Kim, C. Lee and S. H. Ko, A Dual-Scale Metal Nanowire Network Transparent Conductor for Highly Efficient and Flexible Organic Light Emitting Diodes, Nanoscale, 2017, 9, 1978-1985.
Q. Zhang, W. Wei, J. Li, J. Wei and J. Guo, "Insertion of a Biocompatible Polymer Bewteen Graphene and Silver Nanowires for Novel Flexible Transparent Electrode", Synth. Met., 2016, 221, 192-200.

D. S. Leem, A. Edwards, M. Faist, J. Nelson, D. D. Bradley and J. C. de Mello, "Efficient Organic Solar Cells with Solultion-Processed Silver Nanowire Electrodes", Adv. Mater., 2011, 23, 4371-4375.
M. Song, D. S., et al., "Highly Efficient and Bendable Organic Solar Cells with Solution-Processed Silver Nanowire Electrodes", Advanced Functional Materials, 2013, vol. 23, pp. 4177-4184.
A. R. Madaria, A. Kumar and C. Zhou, "Large Scale, Highly Conductive and Patterned Transparent Films of Silver Nanowires on Arbitrary Substrates and Their Application in Touch Screens", Nanotechnology, 2011, 22, 245201.
J. D. Park, S. Lim and H. Kim, "Patterned Silver Nanowires Using the Gravure Printing Process for Flexible Applications", Thin Solid Films, 2015, 586, 70-75.
D. Angmo, T. R. Andersen, J. J. Bentzen, M. Helgesen, R. R. Sondergaard, M. Jorgensen, J. E. Carle, E. Bundgaard and F. C. Krebs, "Roll-to-Roll Printed Silver Nanowire Semitransparent Electrodes for Fully Ambient Solution-processed Tandem Polymer Solar Cells", Adv. Funct. Mater., 2015, 25, 4539-4547.
J. Liang, K. Tong and Q. Pei, "A Water-Based Silver-Nanowire Screen-Print Ink for Fabrication of Stretchable Conductors and Wearable Thin-Film Transistors", Adv. Mater., 2016, 28, 5986-5996.
H. Lu, J. Lin, N. Wu, S. Nie, Q. Luo, C.-Q. Ma and Z. Cui, "Inkjet Printed Silver Nanowire Network as Top Electrode for Semi-Transparent organic Photovoltaic Devices", Appl. Phys. Lett., 2015, 106, 093302.
D. J. Finn, M. Lotya and J. N. Coleman, "Inkjet Printing of Silver Nanowire Networks", ACS Appl. Mater. Interfaces, 2015, 7, 9254-9261.
R.-Z. Li, A. Hu, T. Zhang and K. D. Oakes, "Direct Writing on Paper of Foldable Capacitive Touch Pads with Silver Nanowire Inks", ACS Appl. Mater. Interfaces, 2014, 6, 21721-21729.
S. Mishra, K. L. Barton, A. G. Alleyne, P. M. Ferreira and J. A. Rogers, J., "High-Speed and Drop-on-Demand Printing with a Pulsed Electrochydrodynamic Jet", Micromech. Microeng., 2010, 20, 095026.
C. Wei, H. Qin, N. A. Ramirez-Iglesias, C.-P. Chiu, Y.-s. Lee and J. Dong, J., "High-REsolution AC-Pulse Modulated Electrohydrodyanmic Jet Printing on Highly Insulting Substrates", Micromech. Microeng., 2014, 24, 045010.
Y. Han and J. Dong, J., "Design, Modeling and Testing of Integrated Ring Extractor for High REsolution Electrohydrodynamic (EHD) 3D Printing", Micromech. Microeng., 2017, 27, 035005.
J.-U. Park, M. Hardy, S. J. Kang, K. Barton, K. Adair, D. Kishore Mukhopadhyay, C. Y. Lee, M. S. Strano, A. G. Alleyne, J. G. Georgiadis, P. M. Ferreira and J. A. Rogers, "High-Resolution Electrohydrodynamic Jet Printing", Nat. Mater., 2007, 6, 782.
H. Lee, B. Seong, J. Kim, Y. Jang and D. Byun, "Direct Alighnment and Patterning of Silver Nanowires by Electrohydrodynamic Jet Printing", Small, 2014, 10, 3918-3922.
W. Zeng, L. Shu, Q. Li, S. Chen, F. Wang and X. M. Tao, "Fiber-Based Wearable Electronics" A Review of Mateirals, Fabrication, Devices, and Applications, Adv. Mater., 2014, 26, 5310-5336.
J. A. Rogers, T. Someya and Y. Huang, "Materials and Mechanics for Stretchable Electronics", Science, 2010, 327, 1603-1607.
D. J. Lipomi, M. Vosgueritchian, B. C. Tee, S. L. Hellstrom, J. A. Lee, C. H. Fox and Z. Bao, "Skin-Like Pressure and Strain Sensors Based on Transparent Eleastic Films of Carbon Nanotubes", Nat. Nanotechnol., 2011, 6, 788-792.
M. Park, J. Park and U. Jeong, Nano "Design of Conductive Composite Elastomers for Stretchable Electronics", Today, 2014, 9, 244-260.
S. Hong, H. Lee, J. Lee, J. Kwon, S. Han, Y. D. Suh, H. Cho, J. Shin, J. Yeo and S. H. Ko, "Highly Strechable and Transparent Metal Nanowire Heater for Wearable Electronics Applications" Adv. Mater., 2015, 27, 4744-4751.
S. Choi, J. Park, W. Hyun, J. Kim, J. Kim, Y. B. Lee, C. Song, H. J. Hwang, J. H. Kim, T. Hyeon and D.-H. Kim, "Stretchable Heater Using Ligand-Exchanged Silver Nanowire Nanocomposite for Wearable Articular Thermotherapy", ACS Nano, 2015, 9, 6626-6633.

(56) References Cited

OTHER PUBLICATIONS

J. A. Fan, W.-H. Yeo, Y. Su, Y. Hattori, W. Lee, S.-Y. Jung, Y. Zhang, Z. Liu, H. Cheng, L. Falgout, M. Bajema, T. Doleman, D. Gregoire, R. J. Larsen, Y. Huang and J. A. Rogers, "Fractal Design Concepts for Stretchable Electronics", Mat. Commun., 2014, 5, 3266.

S. Yao and Y. Zhu, "Nanomaterial-Enbled Dry Electrodes for Electrophysiological Sensing" A Review JOM, 2016, 68, 1145-1155.

K. I. Jang, H. N. Jung, J. W. Lee, S. Xu, Y. H. Liu, Y. Ma, J. W. Jeong, Y. M. Song, J. Kim, B. H. Kim, A. Banks, J. W. Kwak, Y. Yang, D. Shi, Z. Wei, X. Feng, U. Paik, Y. Huang, R. Ghaffari and J. A. Rogers, "Ferromagnetic, Folded Electrode Composite as a Soft Interface to the Skin for Long-Term Electrophysiological Recording", Adv. Funct. Mater., 2016, 26, 7281-7290.

A. C. Myers, H. Huang and Y. Zhu, "Wearable Silver Nanowire Dry Electrodes for Electrophyiological Sensing", RSC Adv., 2015, 5, 11627-11632.

\* cited by examiner

Extrusion Printing

EHD Printing

High Speed

Center

Edge

Low Speed

Center

Edge

ELECTROHYDRODYNAMIC PRINTING OF NANOMATERIALS FOR FLEXIBLE AND STRETCHABLE ELECTRONICS

CROSS REFERENCE TO RELATED APPLICATIONS

This application claims the benefit of U.S. Application No. 62/807,012, filed on Feb. 18, 2019, entitled "ELECTROHYDRODYNAMIC PRINTING OF NANOMATERIALS FOR FLEXIBLE AND STRETCHABLE ELECTRONICS, which application is incorporated herein by reference in its entirety.

STATEMENT REGARDING FEDERALLY SPONSORED RESEARCH OR DEVELOPMENT

This invention was made with government support under grant number 1728370 awarded by the National Science Foundation. The Government has certain rights in the invention.

BACKGROUND

Printing is a powerful technique to enable the production of large-scale, low-cost electronic devices and systems. Most of the existing methods for fabricating metal NW conductors are based on solution coating and deposition, including drop casting, spinning coating, spray coating, and Meyer rod coating. Recently, contact printing methods such as gravure printing and screen printing have been reported for printing silver nanowires (Ag NWs). While these methods can achieve high-speed and large-scale printing, the resolution and/or the electric conductivity of the product is typically limited. Moreover, non-contact printing technologies that do not use a cliché have the advantage over contact printing of allowing on-demand patterning.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 24B-2D illustrate plots illustrating the advancing angle and receding angle with respect to the treatment time for modified substrates, in accordance with various embodiments of the present disclosure.

DETAILED DESCRIPTION

Figure 1:
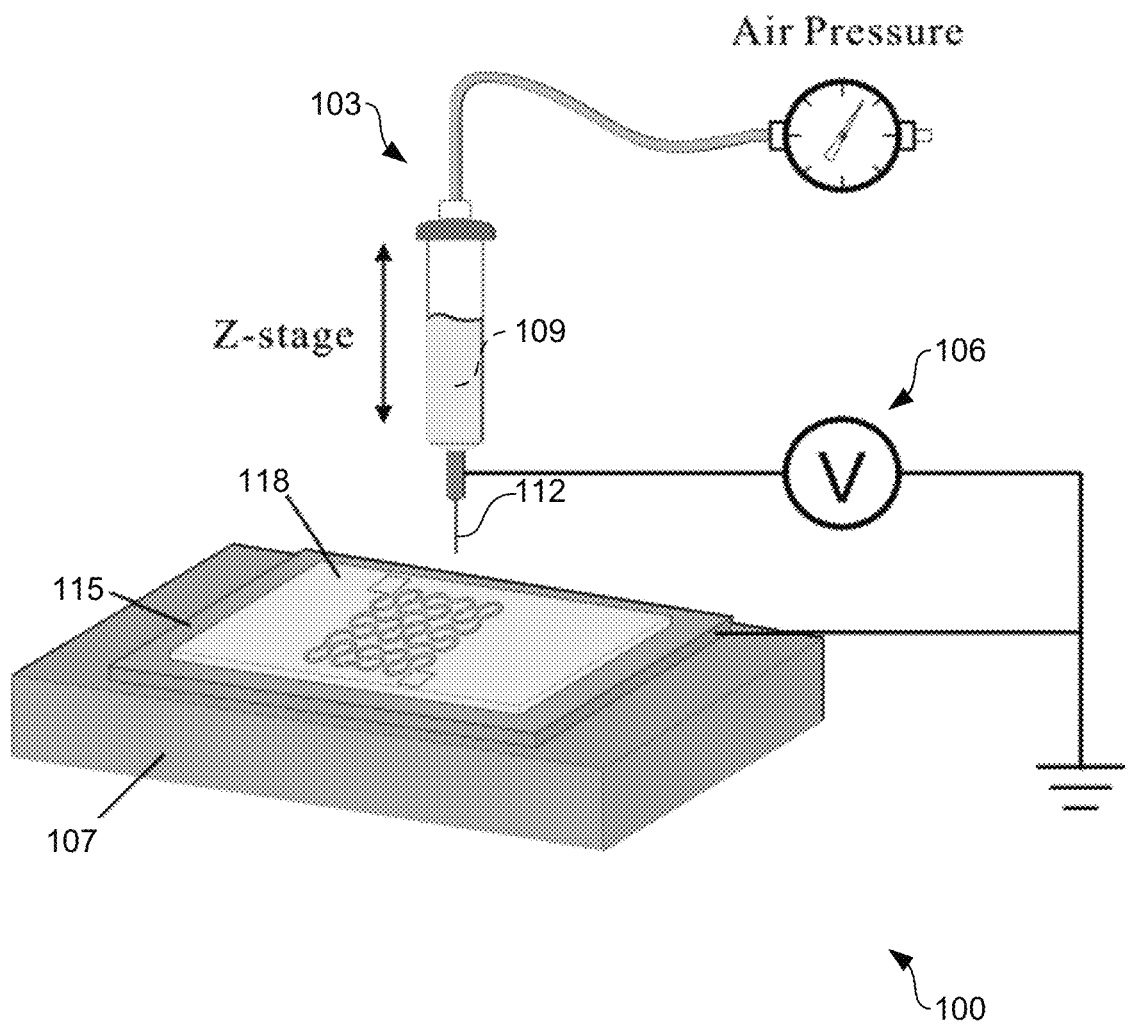
FIG. 1 is an example of a schematic of a printing system, in accordance with various embodiments of the present disclosure.

Disclosed herein are various embodiments related to electrohydrodynamic (EHD) printing of one-dimensional (1D) nanomaterials. Specifically, the present disclosure relates to scalable, high-resolution and mask-less printing of 1D nanomaterials using EHD printing. The 1D nanomaterials of the present disclosure can comprise nanowires, nanotubes, nanorods, nanofibers, and/or any other type of 1D nanomaterial as can be appreciated. Further disclosed are two surface modification method to modify polydimethylsiloxane (PDMS) surfaces to achieve reliable and tunable EHD printing of Ag NW according to various embodiments.

According to various embodiments, an ink can be formed by mixing a concentration of the nanomaterial solution with a polymer concentration (e.g., poly(ethylene oxide)) in a major solvent (e.g., de-ionized water). In some embodiments, the ink can be placed in an EHD printer device comprising a pneumatic dispensing system, a voltage supply system, and a three-axis translation stage. The one-dimensional nanomaterial can be printed according to a predefined pattern by (1) applying pressure to the ink, thereby causing the ink to flow to the tip of a printer nozzle to form a meniscus, and (2) applying a voltage between the printer nozzle and a ground electrode that is below the substrate. The resulting electrostatic force ejects the ink onto a substrate on the translation stage. Factors that affect the resolution quality of the printed 1D nanomaterial include applied pressure, voltage, stand-off distance, printing speed, nozzle size, and/or any other factors as can be appreciated. Further, based on the type of nanomaterial solution, the 1D nanomaterial can be a conductor, a semi-conductor, or an insulator. The printed nanomaterial can be used for a variety of applications, including flexible heaters and electrophysiology.

According to various embodiment, the present disclosure further relates to two surface modification methods, ultraviolet ozone (UVO) treatment and dopamine coating, to modify polydimethylsiloxane (PDMS) surfaces to achieve reliable and tunable EHD printing of Ag NWs. The hydrophobic stabilities of the two surface modification methods and the effect of the modification methods including doses on EHD printing performances are investigated, such as resolution and conductivity of the printed patterns. The surface modification methods along with the proper printing conditions can be selected to tailor and optimize the printing performances. According to various embodiments, an electronic tattoo based on fractal pattern of Ag NWs is printed on the modified PDMS substrate to demonstrate the potential of the reported surface modification on reliable EHD printing of Ag NWs based stretchable devices.

Example 1: Electrohydrodynamic Printing of Silver Nanowires (Ag NWs)

Flexible and stretchable conductors, a key component in flexible and stretchable electronics, have garnered significant attention from the scientific community and industry. Metal nanowires (NWs) in the form of random percolation network have shown excellent potential as flexible and stretchable conductors. For a random network at a given material density, longer NWs can lead to higher electric conductivity according to the percolation theory and larger stretchability, which are desirable for flexible and stretchable conductors. Longer NWs can also help achieve a better balance between electric conductivity and optical transmittance (i.e., increasing electric conductivity without reducing optical transmittance), critical for transparent electrodes made of metal NWs.

Inkjet printing, a representative form of non-contact printing, is widely used for printing electronic devices. Ink-jet printing of long metal NWs (typically >10 µm), however, is challenging due to the risk of nozzle clogging and the difficulty to maintain the structural integrity of the NWs through the printing process. The resolution of ink-jet printing is mainly limited by the size of the printer nozzle, with the printed droplets at the same scale of nozzle size. For ink-jet printing, as a general "rule of thumb," the size of the particles in the ink is suggested not to exceed $1/100$ times the diameter of the printhead nozzle, so as to reduce the risk of nozzle clogging. Considering the length of typical Ag NWs to be >10 µm, it is extremely difficult for inkjet printing to produce high-resolution features. There have been a few studies of applying inkjet printing for metal NWs, however, the resolution in these studies is generally at sub-mm scale, which is far from the requirement of advanced electronic devices. Electrohydrodynamic (EHD) printing is an emerging technique that can evade the dilemma of printing resolution and nozzle clogging. Due to the unique printing mechanism in EHD printing, the printed jet or droplet can be a few orders of magnitude smaller than the nozzle diameter. Moreover, as a direct printing approach, EHD printing does not require a mask for device fabrication.

According to various embodiments, the present disclosure relates to high-resolution, large-scale printing of 1D nanomaterials (e.g., nanowires, nanorods, nanotubes, etc.), including highly conductive Ag NWs. It should be noted that while the disclosure primarily discusses the printing of highly conductive Ag NWs, the 1D nanomaterials printed using the process and system disclosed herein can comprise a conductor, a semi-conductor, or an insulator. For a conductive nanomaterial, the nanomaterial can comprise silver (Ag), gold, nickel, aluminum copper, and/or any other type of conductive metal, as can be appreciated.

According to various embodiments, highly conductive Ag NWs for flexible and stretchable electronics can be printed using EHD printing. Nanomaterial ink can be designed and synthesized for EHD printing. The smallest line width obtained in experiments using the processes and systems of the present disclosure was ~45 µm. After post treatment, printed Ag NWs showed an electric conductivity as high as 5.6×10⁶ S/m. Flexibility and stretchability of the printed patterns were characterized under cyclic bending and stretching tests. Devices based on the printed Ag NWs were demonstrated including flexible heaters and stretchable dry electrodes for electrophysiology.

FIG. 1 shows an example of a schematic of the printing system 100, according to various embodiments of the present disclosure. The EHD printing system 100 of the present disclosure includes three sub-systems: a pneumatic dispensing system 103, a voltage supply system 106, and a precision three-axis translation stage 107. The pneumatic system 103 provides pressure to the nanomaterial solution 109 (e.g., Ag NW solution) to facilitate the ink flow from the printing nozzle 112. The voltage supply 106 can be connected to the printing nozzle 112 and the ground electrode 115 on which the substrate 118 sits. The precision three-axis stage 107 can be used position the substrate 118 (and the ground electrode 115) with a precision of about 100 nanometers (nm). In the experiment, a side-view camera was used to monitor and record the printing process.

Figure 2:
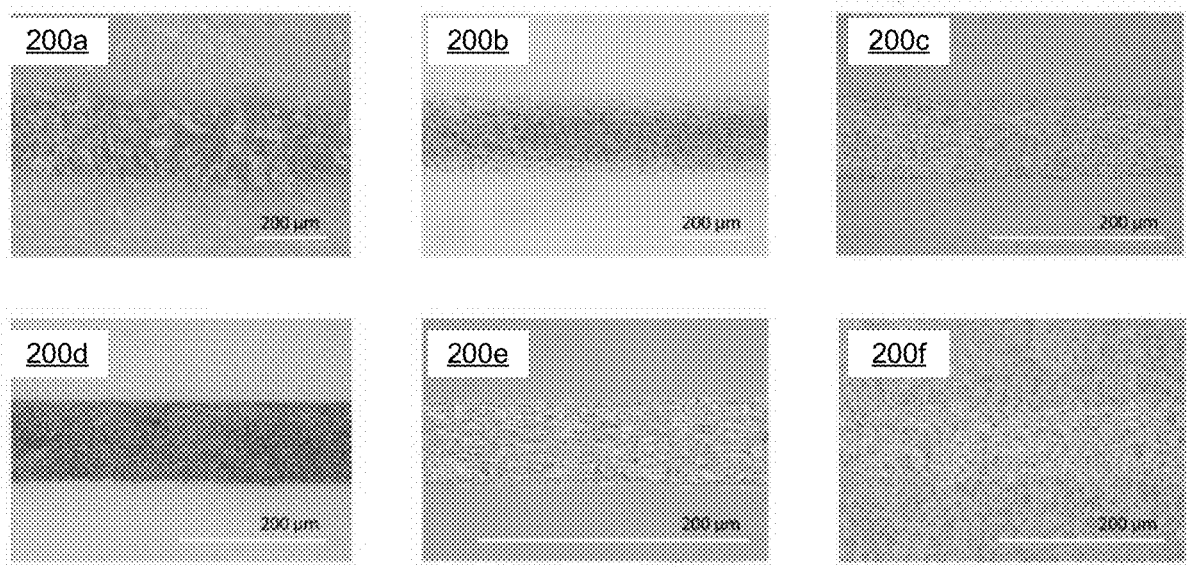
FIG. 2 is an illustration of examples of optical images of AgNW lines printed on various substrates using the printing system of FIG. 1, in accordance with various embodiments of the present disclosure.

FIG. 2 illustrates examples of optical images of nanomaterial (e.g., Ag NW) lines printed on various substrates. In particular, example 200a illustrates nanomaterial lines printed on letter paper, example 200b illustrates nanomaterial lines printed on glass, example 200c illustrates nanomaterial lines printed on polyethylene terephthalate (PET), example 200d illustrates nanomaterial lines printed on nanofiber paper, example 200e illustrates nanomaterial lines printed on PDMS, and example 200f illustrates of nanomaterial lines printed on polycarbonate filter.

Figure 3A:
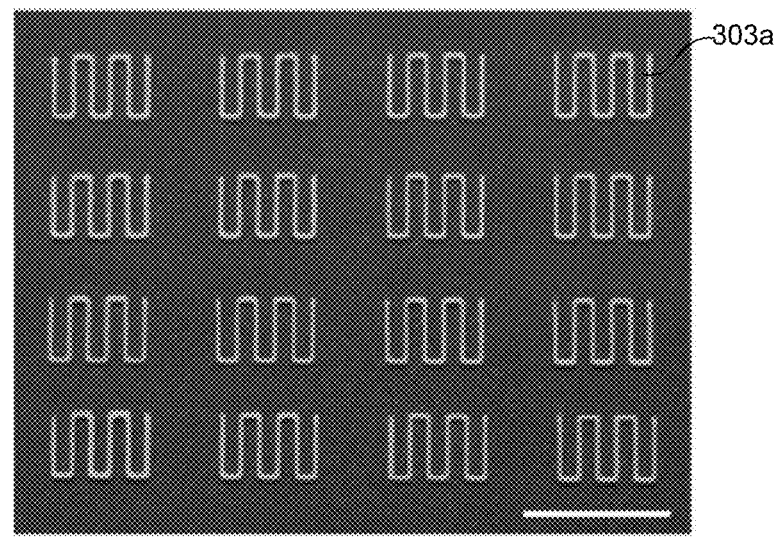
FIGS. 3A-3C are photos of examples of patterns printed by the printing device of FIG. 1, in accordance with various embodiments of the present disclosure.
Figure 3B:
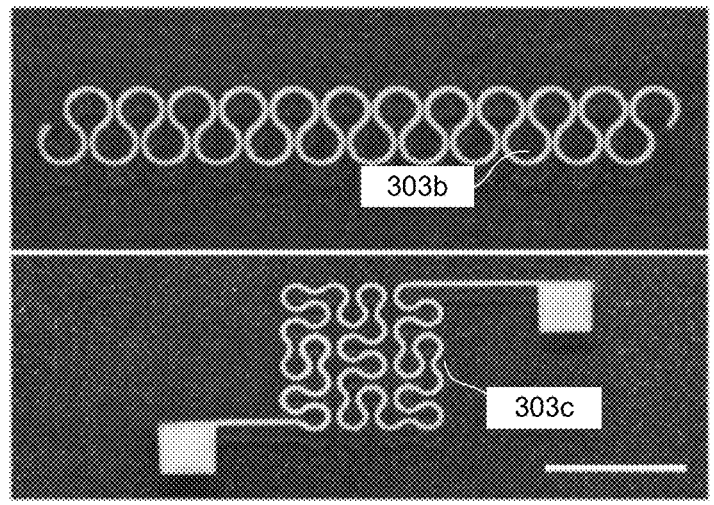
Figure 3C:
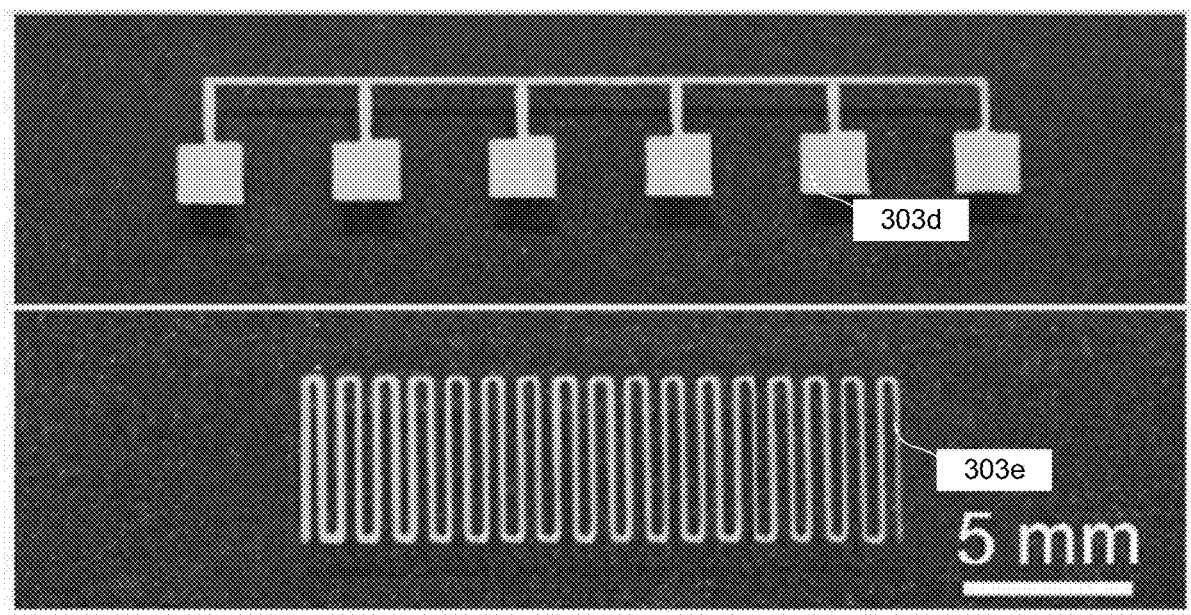

FIG. 3A illustrates an example of a photo illustrating repeated patterns 300a printed by EHD printing in a large scale, according to various embodiments of the present disclosure. Specifically, FIG. 3A illustrates repeated patterns 303a indicating the potential of this technique for large-scale, high-resolution printing of nanomaterial (e.g., Ag NWs) devices. FIG. 3B illustrates a photo of two examples of complicated patterns 300b, 300c printed by the EHD printer system 100 according to various embodiments of the present disclosure. FIG. 3C illustrates a photo of additional examples of AgNW patterns 303d, 303e printed on a glass slide.

Figure 4A:
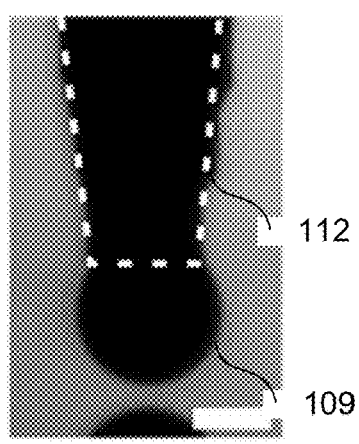
FIGS. 4A-4B are optical images of an example of the printing nozzle (marked by the white dash lines) with extrusion printing and EHD printing, in accordance with various embodiments of the present disclosure.
Figure 4B:
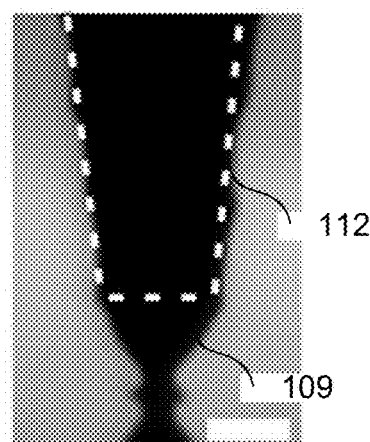
Figure 5:
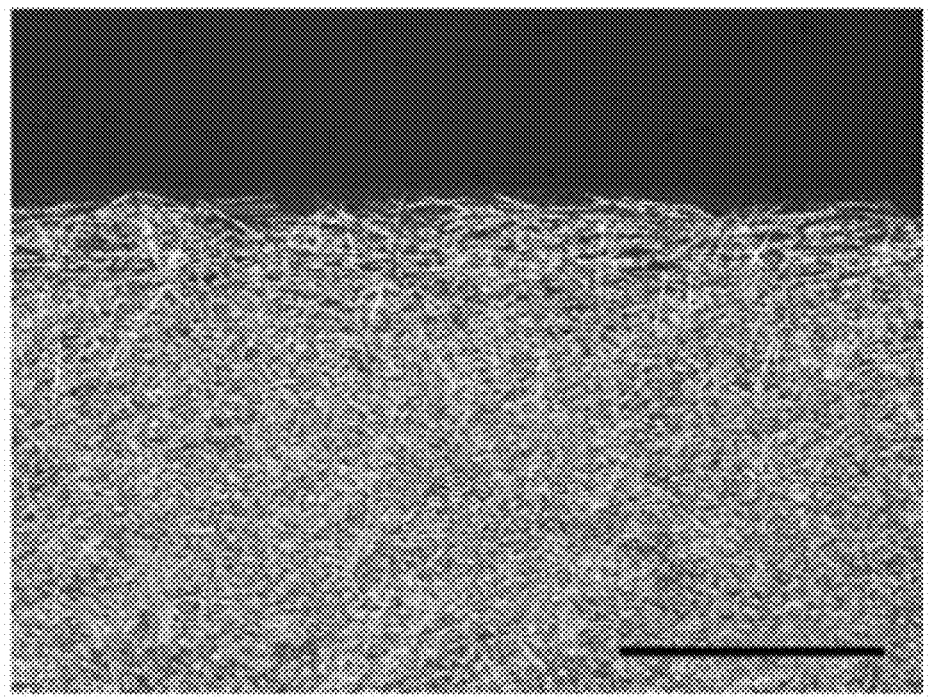
FIG. 5 is an optical image of a printed line, showing the smooth edge of the printed line.

FIGS. 4A and 4B illustrate optical images of the EHD printing nozzle 112 according to various embodiments of the present disclosure. FIG. 4A illustrates an optical image of the EHD nozzle 112 with the voltage on and FIG. 4B illustrates an optical image of the EHD nozzle 112 with the voltage off. FIG. 5 illustrates an example of an optical image of the sharp edge of printed nanomaterial (e.g., Ag NW) and dense nanomaterial network with a scale bar of 50 µm.

Nanomaterial ink 109 can be synthesized and customized for EHD printing. Important ink parameters include viscosity and the nanomaterial concentration. Deionized (DI) water can be used as the major solvent. A polymer, such as, for example, Poly(ethylene oxide) (PEO) can be added to the ink to tune the viscosity.

Figure 6:
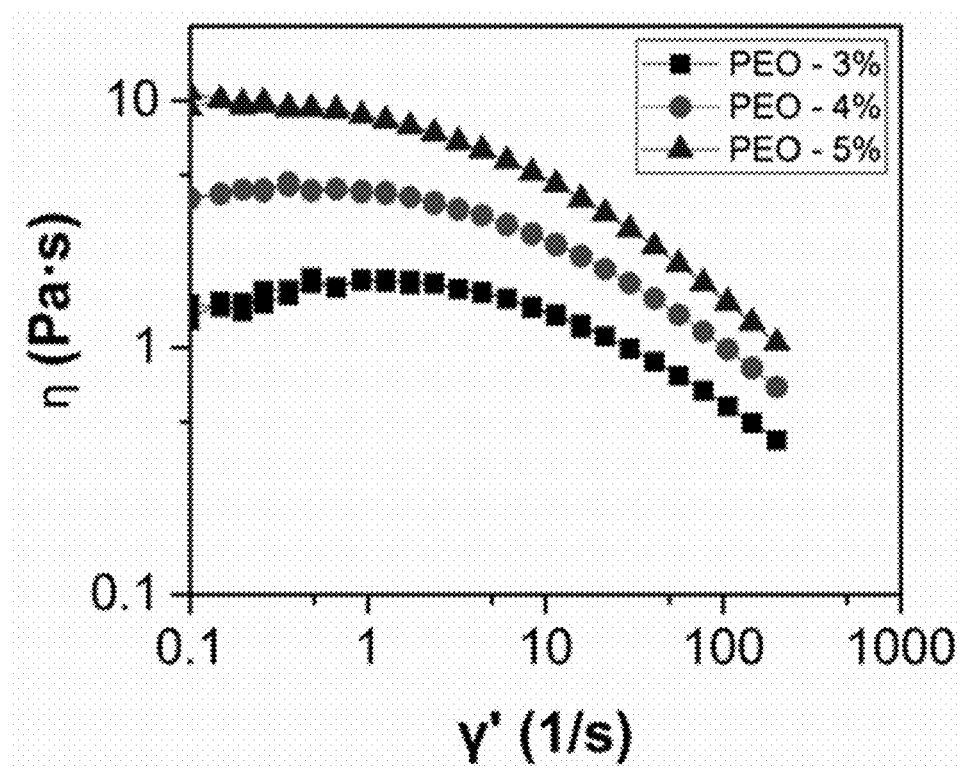
FIG. 6 is a plot illustrating an example of the shear viscosity for three different AgNW ink formulations, in accordance with various embodiments of the present disclosure.

The rheological behavior of AgNW inks 109 with different PEO concentrations (3%, 4%, 5% weight ratio) was investigated. All three inks 109 displayed a shear thinning thixotropic behavior. AgNW ink 109 with higher PEO concentration exhibited higher viscosity at the same shear rate. For instance, the viscosities at shear rate of $1\ s^{-1}$ for PEO concentration of 3%, 4% and 5% were 1.89, 4.28 and 8.61 Pa·s, respectively. FIG. 6 illustrates a plot of the shear viscosity for the three different AgNW ink formulations.

Figure 7:
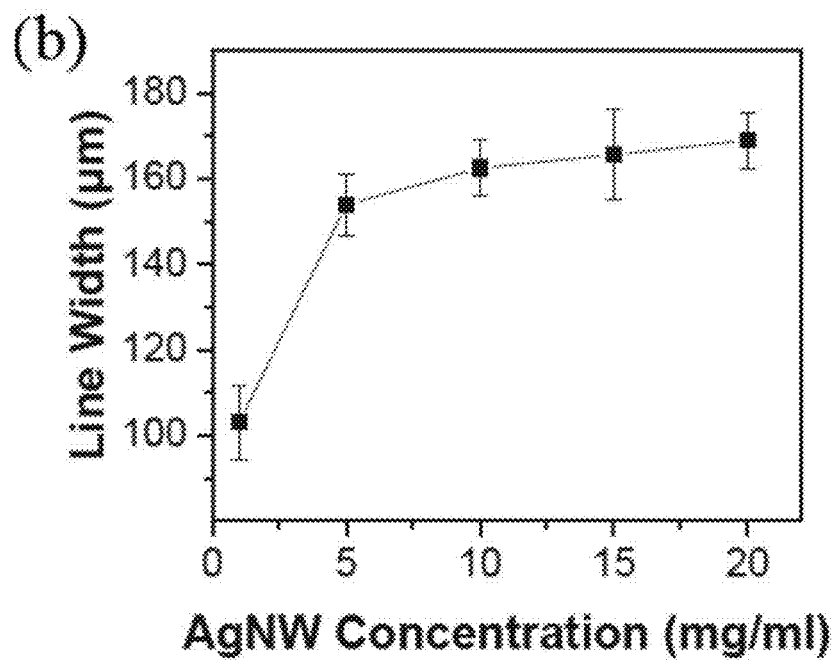
FIG. 7 is a plot illustrating the line width versus the AgNW concentration in different AgNW in formulations, in accordance with various embodiments of the present disclosure.

For the experiments, a 4 wt. % PEO was selected to be optimal. However, the PEO concentration in the nanomaterial ink can be higher or lower. Higher PEO concentration can cause nozzle clogging, while lower concentration can reduce the printing resolution. Higher AgNW concentration can improve the conductivity of the printed pattern 303, but might cause AgNW clustering in the ink 109, increasing the possibility of nozzle clogging. On the other hand, higher AgNW concentration might decrease the printing resolution as more NWs can be dragged out of the nozzle 112 during printing. FIG. 7 illustrates a plot of the line width versus the AgNW concentration in the inks according to various embodiments of the present disclosure. For the experiments, AgNW concentration of 15 mg/ml was selected to be optimal. However, the concentration of the nanomaterial can be higher or lower based at least in part on the desired conductivity and resolution quality.

According to various embodiments, the EHD printing process can be affected by several parameters, including applied pressure, voltage, stand-off distance (distance between printing head and substrate), printing speed, and nozzle size. Due to the viscosity of the ink 112 and relatively small nozzle 112 used in experiments, a small air pressure of about 0.4 psi was applied to the system 100 to facilitate the ink flow to the nozzle tip. Applied voltage and the resulting electrostatic field are also factors in achieving the high printing resolution. Without the voltage, the ink 109 will just flow out, and accumulate around the nozzle tip to form a ball shape, which produces large droplets leading to low-resolution printing. According to various embodiments, a voltage can be applied between the nozzle 112 and the ground electrode 115 to initiate and maintain EHD printing. The voltage applied in the experiments was about 1500V. The electrostatic force can deform the meniscus into a Taylor Cone, and eject a fine jet from the Taylor Cone (FIGS. 4A-4B), leading to high-resolution printing.

Figure 8:
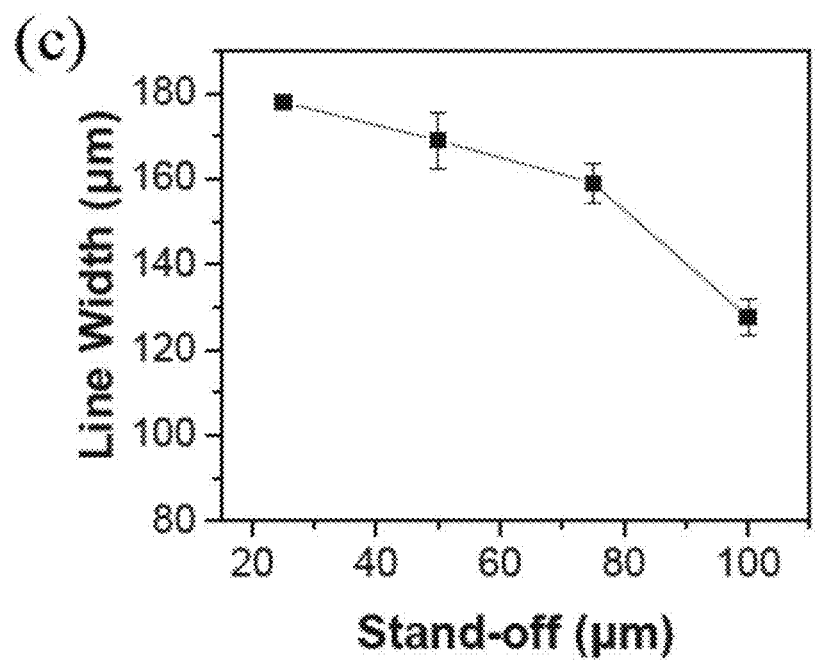
FIG. 8 is a plot illustrating the line width versus stand-off distance, in accordance with various embodiments of the present disclosure.
Figure 9:
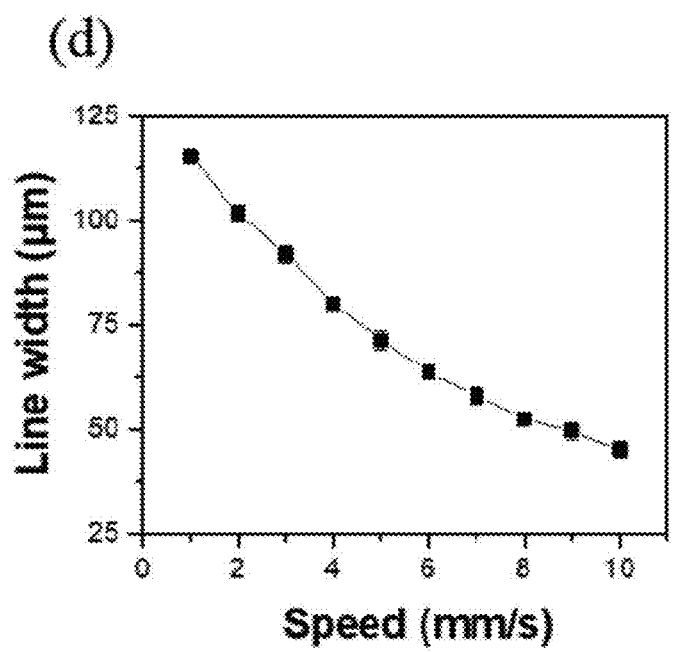
FIG. 9 is a plot illustrating the line width versus printing speed, in accordance with various embodiments of the present disclosure.

Moreover, both printing speed and stand-off distance can affect the printing resolution and stability of the printing process. Higher printing speed and larger stand-off distance provide better printing resolution. As shown in FIG. 8, the line width decreased with the increasing stand-off distance, due to the reduced jet diameter from the Taylor Cone. A stand-off distance of about 75 µm was selected. However, the stand-off distance can be greater or less, as can be appreciated. As shown in FIG. 9, the line width decreases as the printing speed increases. At higher printing speeds with the same ink flow rate, a smaller amount of ink 109 per unit length leads to a smaller line width. Printed nanomaterial patterns 303 created using the processes and printer 100 of the present disclosure had clean and smooth edge as shown in FIG. 5, which is essential for circuit design, such as transistors and interdigitated sensors.

Figure 10A:
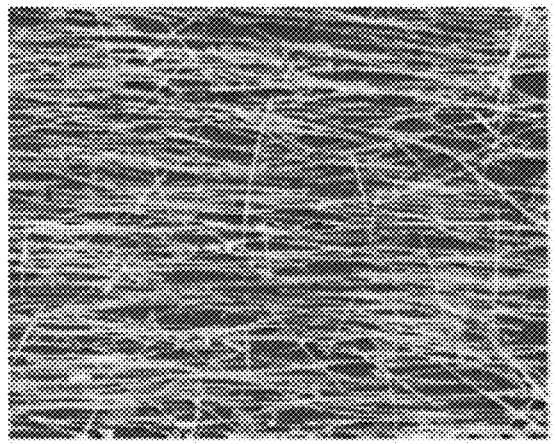
FIGS. 10A-B are images of nanowires at the center and the edge of the printed lines at two different printing speeds, in accordance with various embodiments of the present disclosure.
Figure 10A:
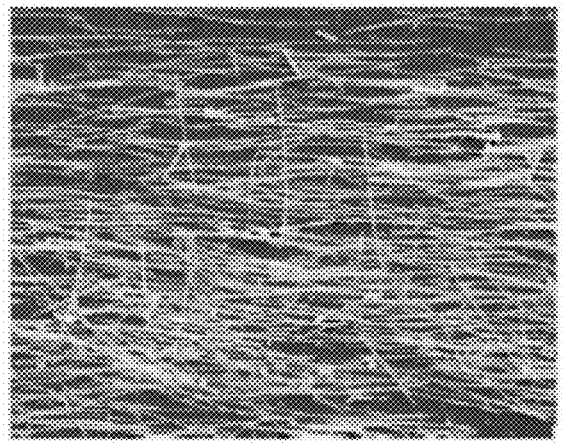
Figure 10B:
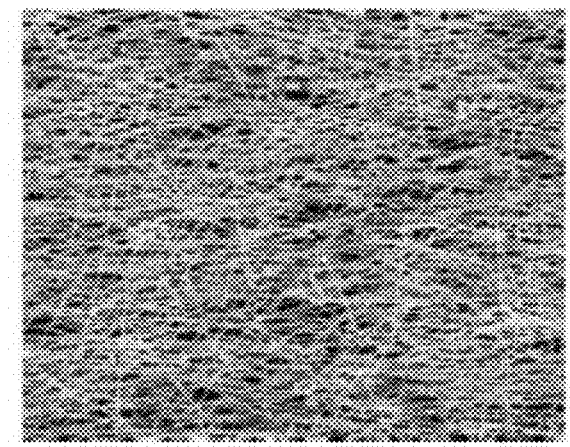
Figure 10B:
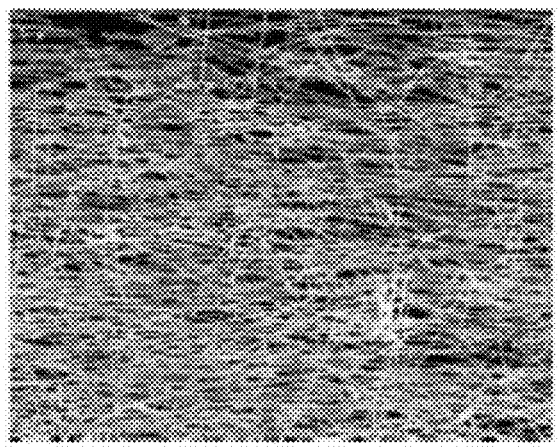
Figure 11A:
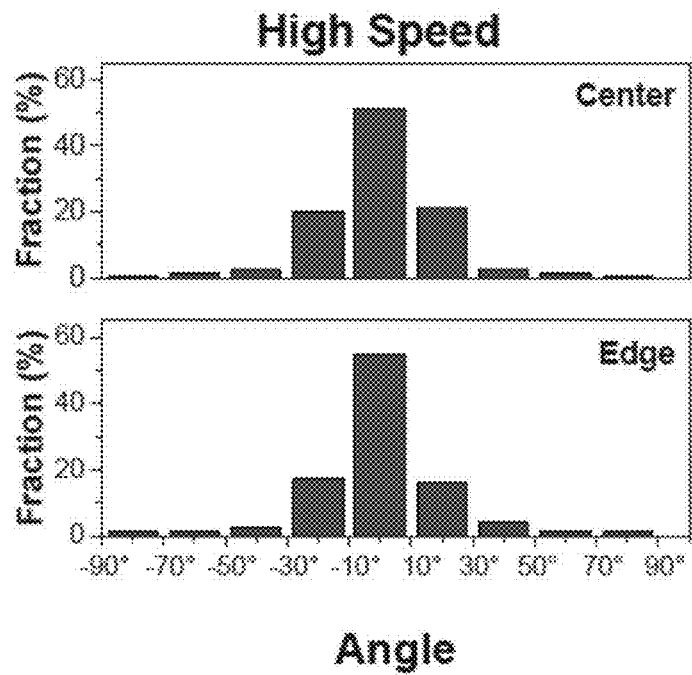
FIGS. 11A-11B are graphical representations of the AgNW alignment at the center and the edge of the printed line when printed at high speed and low speed, in accordance with various embodiments of the present disclosure.
Figure 11B:
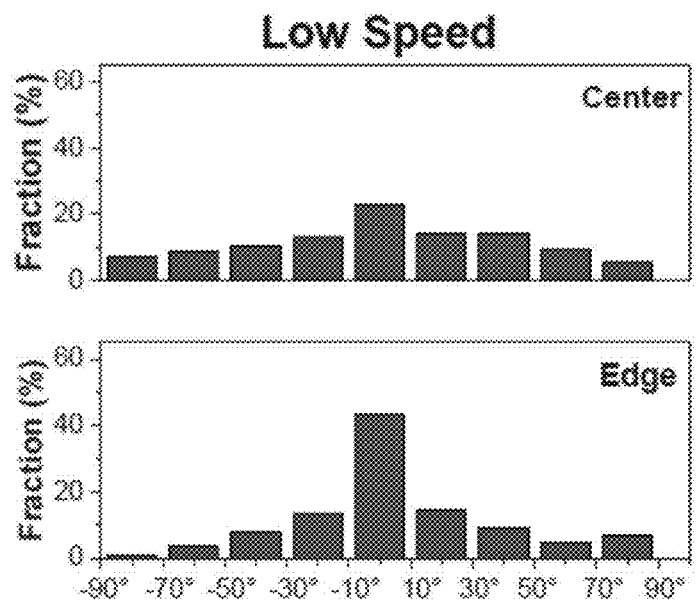

SEM images of the NWs at the center and the edge of the printed lines at two different printing speeds (high speed 10 mm/s and low speed 1 mm/s) were shown in FIGS. 10A and 10B. NW alignment and density can be evaluated from these images. In each case, the number of NWs under the same area was counted and the NW orientation was denoted from −90 to 90° with 0° pointing to the printing direction. It was observed that at the higher printing speed, most NWs (70%) are oriented from −10 to 10° with respect to the printing direction, slightly more aligned along the edges than at the center, due to the liquid drag force from high-speed printing (FIG. 11A). At the lower printing speed, NWs are distributed more randomly in the center, but more aligned in −10 to 10° along the edge (FIG. 11B). It is well known that the NWs are randomly oriented forming a percolation network when drop casted. The alignment phenomenon observed above can be attributed to the shear flow. The shear flow along the liquid edge helps achieve better NW alignment along the edge than at the center; higher printing speed can result in better NW alignment due to higher shear flow rate.

According to various embodiments, the conductivity of the printed nanomaterials can be improved via a post treatment process. In some embodiments, the conductivity of a conductive nanomaterial can be increased removing at least a portion of the polymer from the printed nanomaterial. The polymer can be removed via a soaking and drying process, a heating treatment process, and/or any other process that can remove the polymer form the 1D nanomaterial, as can be appreciated. In one non-limiting example, printed AgNW patterns 303 were soaked in DI water for five minutes to remove PEO and then dried at 50° C. This process can be repeated to remove the polymer completely. After post treatment, the smallest line width achieved in this work was ~45 µm.

Figure 12A:
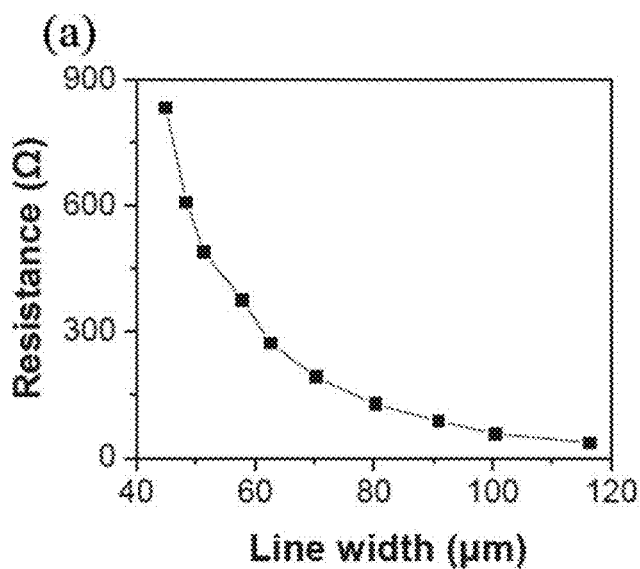
FIGS. 12A-12C are plots showing the electrical properties of printed AgNW lines at different line widths, in accordance with various embodiments of the present disclosure.
Figure 12B:
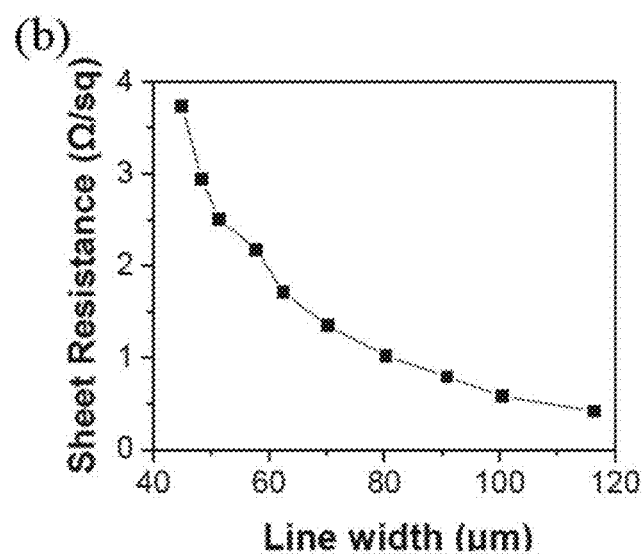
Figure 12C:
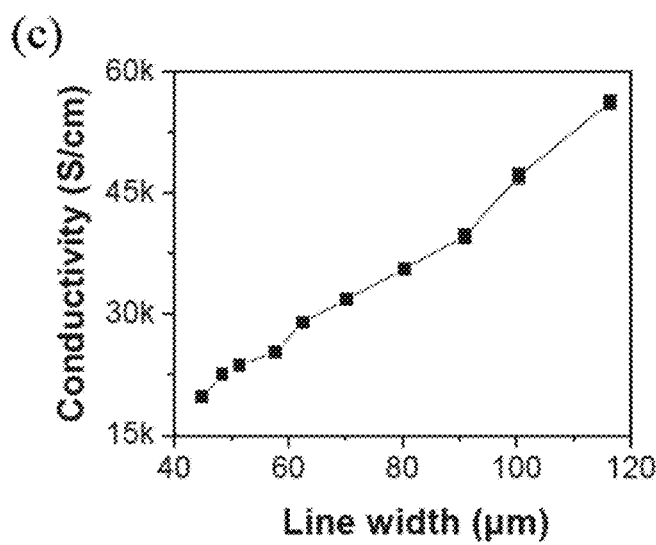
Figure 13:
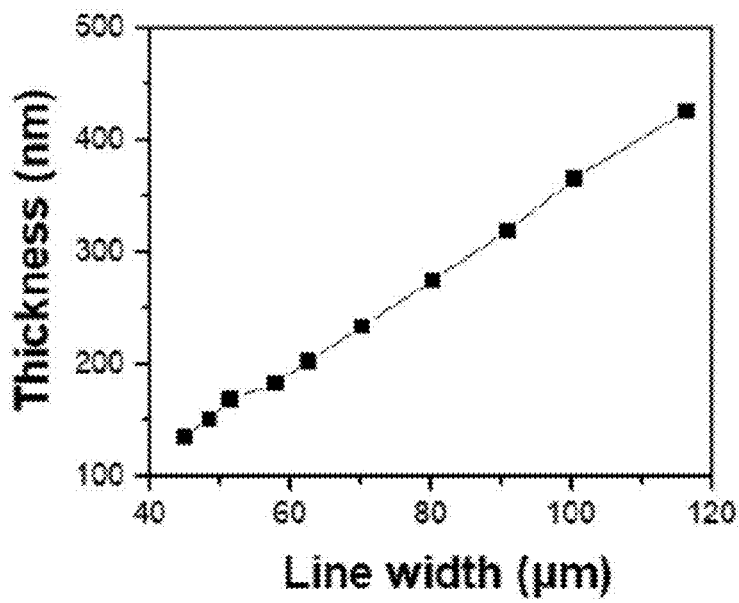
FIG. 13 is a plot showing the relationship between the thickness of a printed line and the printing speed, in accordance with various embodiments of the present disclosure.
Figure 14:
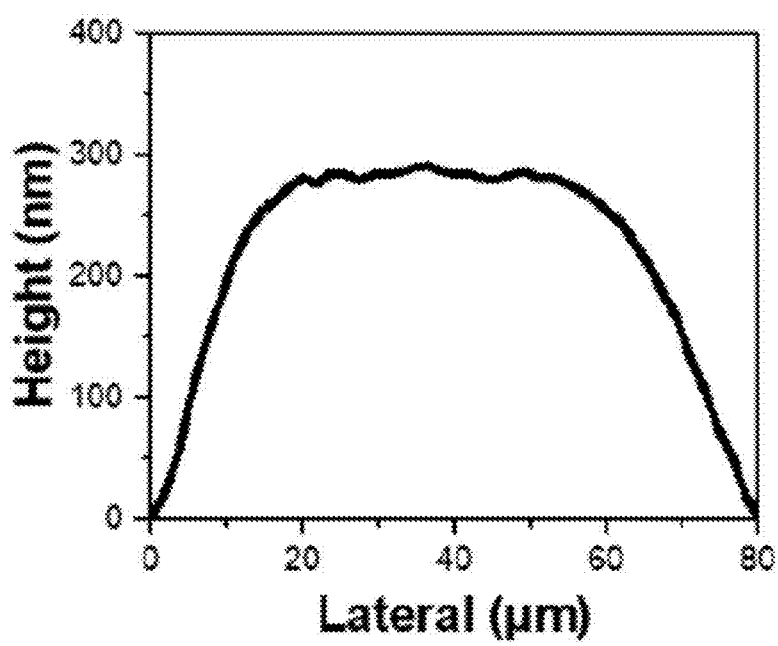
FIG. 14 is a plot showing an example of a profile image of a printed line, in accordance with various embodiments of the present disclosure.

Electrical conductivity of the printed nanomaterial lines was characterized after the post treatment. FIGS. 12A-12C illustrate plots showing the electrical properties of printed Ag NW lines with different line widths. Specifically, FIG. 12A illustrates a plot showing the resistance of the printed Ag NW lines with different line widths. FIG. 12B illustrates a plot showing the sheet resistance of the printed Ag NW lines with different line widths. FIG. 12C illustrates a plot showing the conductivity of the printed Ag NW lines with different line widths. The patterns 303 used for measurement had the same length of 10 mm but varying line width from 45 to 115 µm, controlled by the printing speed. Four-point measurement was used to measure the resistance of each sample accurately. Ag NW lines with larger line widths possessed smaller resistances, as shown in FIG. 12A. In order to obtain sheet resistance and conductivity, pattern thickness and cross-sectional area were measured by Veeco Dektak 150 Profilometer. FIGS. 12B and 12C show that as the line width increases, the pattern 303 becomes more conductive. This is mainly because higher printing speed leads to lower density of NWs and hence lower electric conductivity. NW alignment did not appear to play an important role in the electric conductivity in this case. As mentioned earlier, when printing these lines, the only varying parameter was the printing speed, while all other parameters remained constant such as the Ag NW concentration and stand-off distance. FIG. 13 illustrates a plot showing that the thickness of a printed line decreases as the printing speed increases. FIG. 14 illustrates a plot of an example of a profile image of a printed Ag NW line with a line width of ~80 µm.

This EHD printing technique of the present disclosure enables direct nanomaterial patterning on a variety of substrates with high resolution, as long as the substrate surfaces are hydrophilic for stable ink settlement. In an experiment, Ag NW patterns 303 were successfully printed on PDMS (dopamine treated), PET, glass, letter paper, nanofiber paper, polycarbonate filter (Whatman 111103) and nature rubber latex (lab use gloves).

Figure 15A:
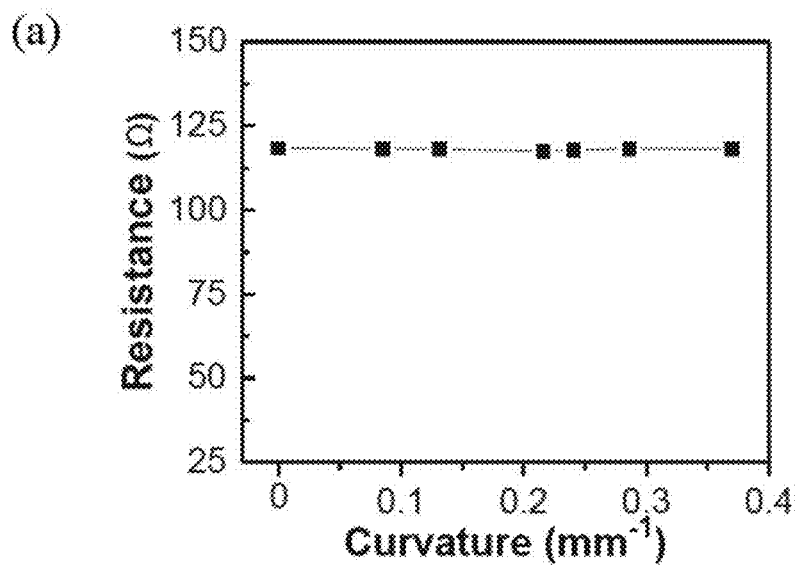
FIGS. 15A-15D are plots illustrating stable resistance of printed AgNW patterns under bending and stretching tests, in accordance with various embodiments of the present disclosure.
Figure 15B:
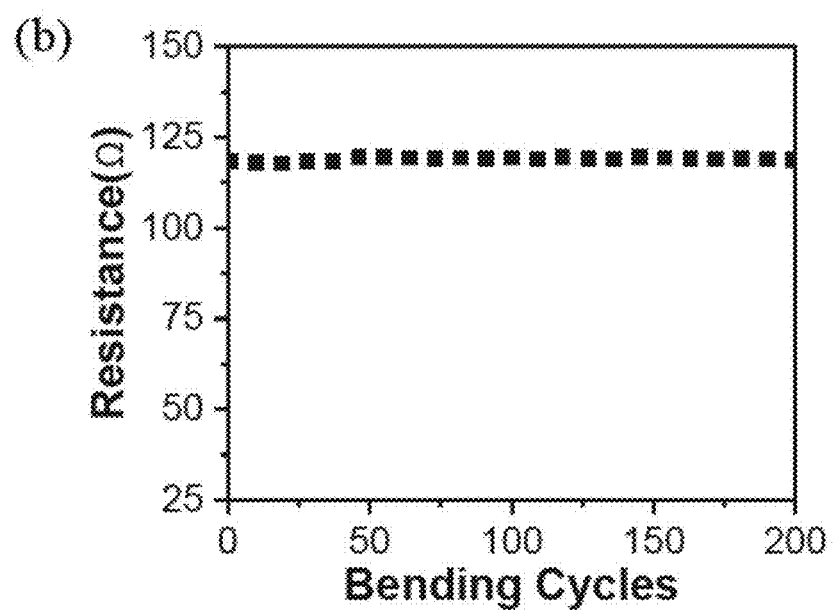
Figure 15C:
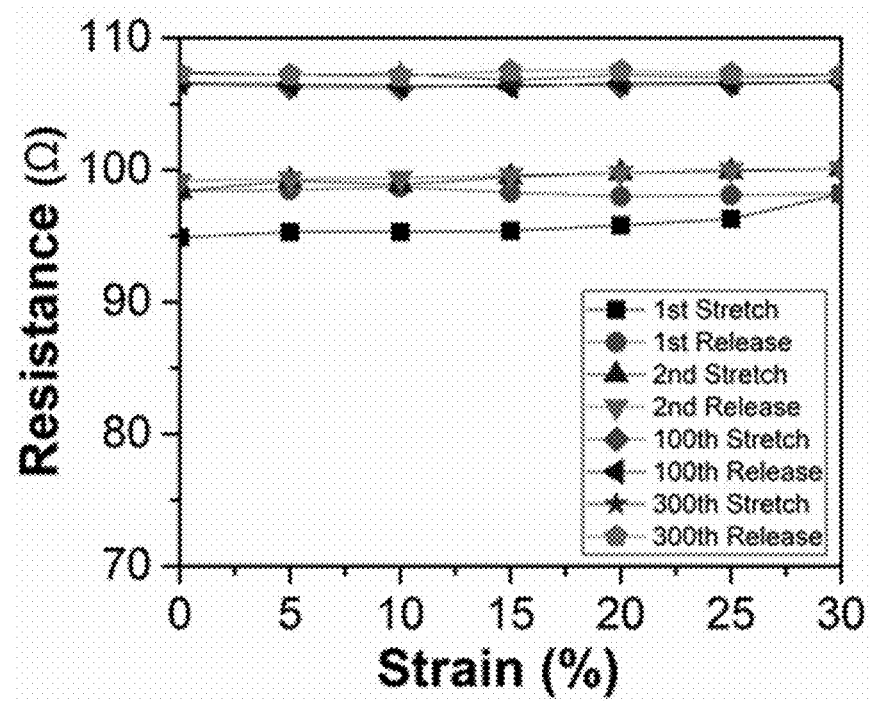
Figure 15D:
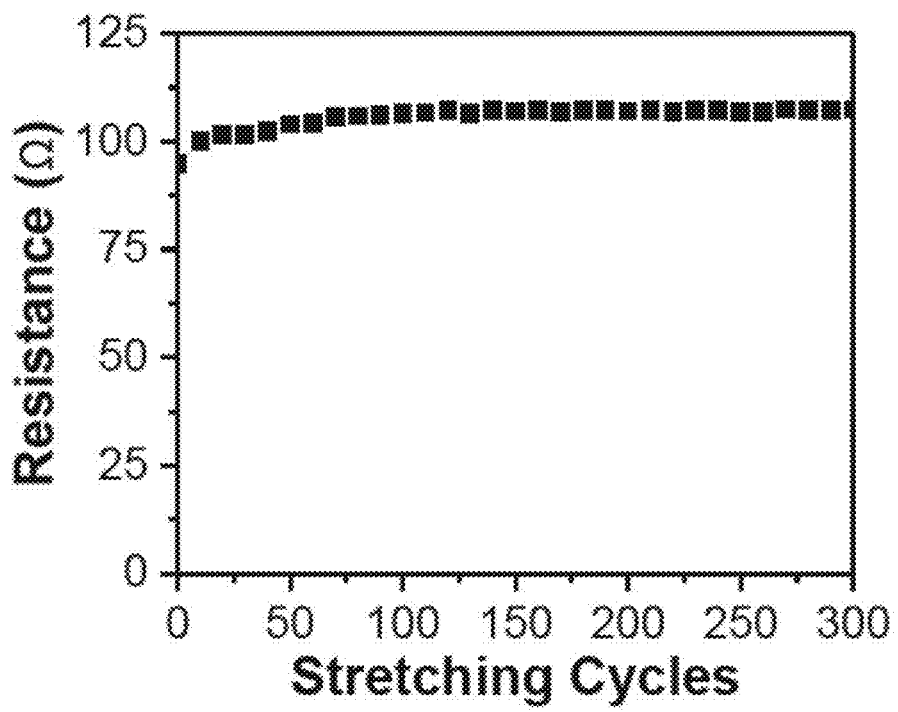
Figure 16:
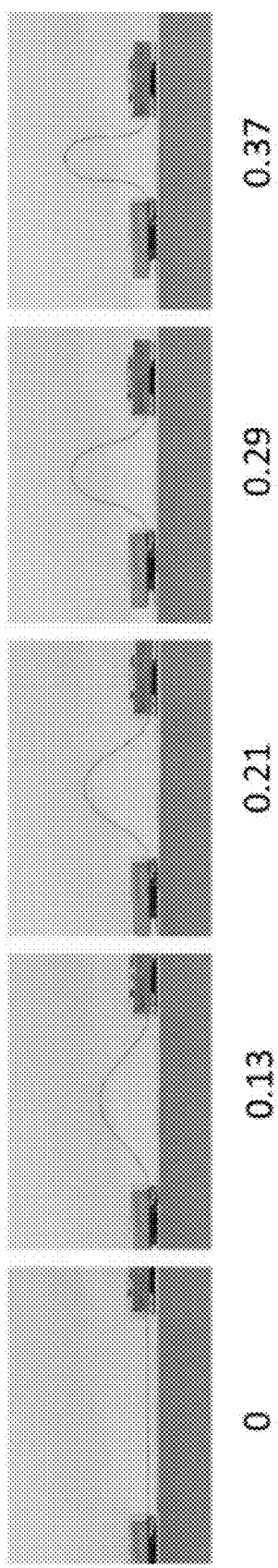
FIG. 16 is an illustration of consecutive images showing the bending process of printed AgNWs, in accordance with various embodiments of the present disclosure.
Figure 17:
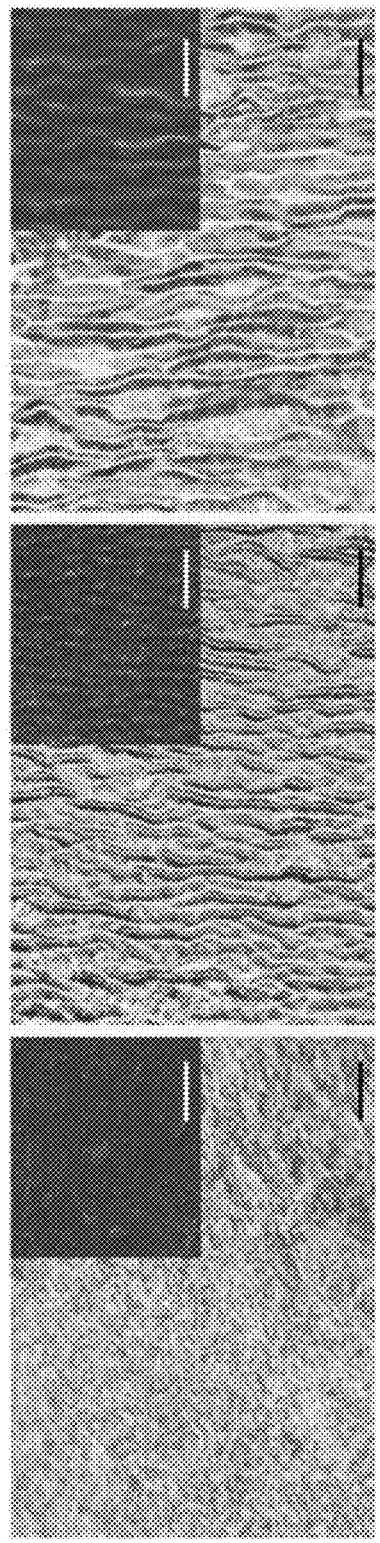
FIG. 17 is an illustration of optical images taken during tensile tests showing the AgNW/PDMS wavy structure and correlating with the resistance values, in accordance with various embodiments of the present disclosure.

Flexibility and stretchability of the printed Ag NW conductors were evaluated, which are of importance relevance for their potential applications in wearable electronics. Bending and tensile tests of the printed Ag NWs conductors were carried out. FIGS. 15A-15B illustrate plots of stable resistance of printed Ag NW patterns under bending and stretching tests. Ag NWs were printed on a flexible substrate, PET, for the bending tests. FIG. 15A illustrates a plot of the resistance as a function of bending curvature. The bending angle started from 0° to 180° as shown in the inset of FIG. 15A. Given the thickness of the PET film of 0.12 mm, the maximum strain in the AgNWs at bending angle of 180° was estimated to be 0.76% (with the smallest bending radius ~2.7 mm). FIG. 15B illustrates a plot of the resistance under multiple bending cycles. As shown in FIG. 15B, the sample showed a stable resistance reading with 200 cycles of repeated bending. Consecutive images showing the bending process can be found in FIG. 16. FIG. 15C illustrates a plot of resistances as a function of strain under selected stretching and releasing cycles. For these tensile tests, Ag NWs were printed on a PDMS substrate 118 that was pre-strained at 50%, which was then released after post treatment of the printed Ag NWs. This pre-straining/releasing step was to generate a wavy Ag NW/PDMS structure, which is a commonly used strategy to generate stretchable conductors with nearly constant resistance during subsequent stretching. The as-prepared sample was then cyclically stretched to 30% strain with the resistance value recorded simultaneously. At the beginning of the tests of the wavy Ag NW conductor, the resistance increased a little with the increasing number of cycles (i.e. 10.6% increase in 50 cycles)(FIG. 15D). Afterwards, the resistance showed excellent stability. In-situ SEM and optical images were taken during the tensile tests to capture the detailed Ag NW/PDMS wavy structure and correlate with the resistance values (FIG. 17). From the bending and tensile testing, the printed Ag NW-based conductors exhibited excellent flexibility and stretchability, critical for many wearable device applications.

Figure 18:
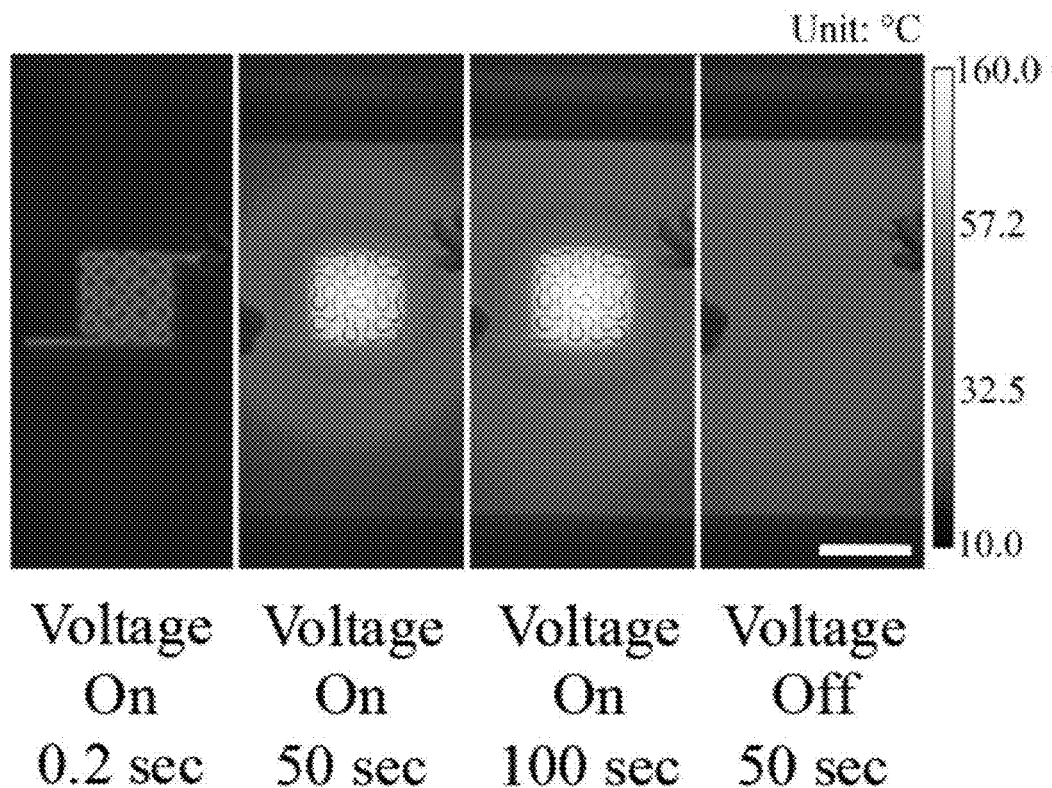
FIG. 18 is an illustration of consecutively captured infrared images during an ON-OFF cycle of an electric heater using a manufactured AgNW printed using the printing device, in accordance with various embodiments of the present disclosure.
Figure 19:
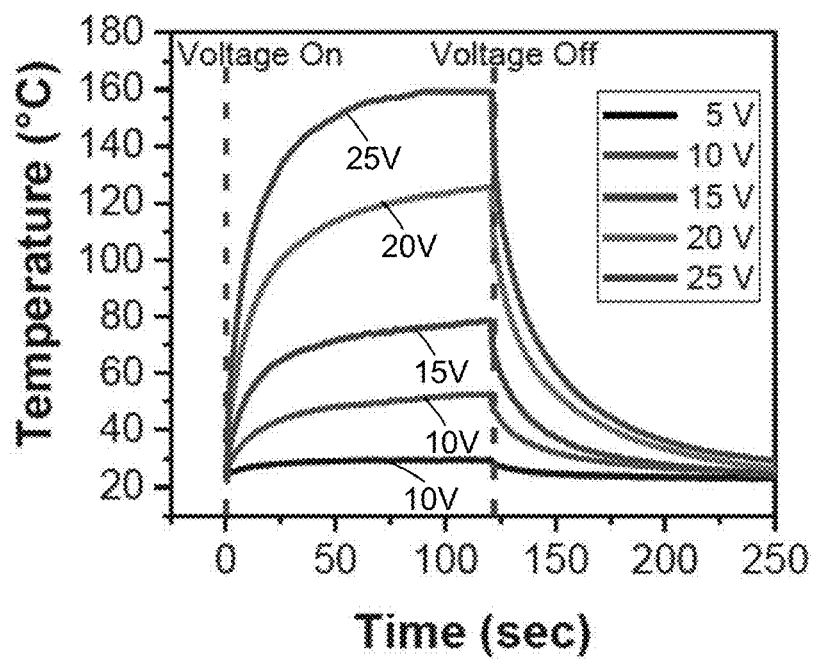
FIG. 19 is a plot of the time-dependent temperature profile of the electric heater at different voltages, in accordance with various embodiments of the present disclosure.
Figure 20:
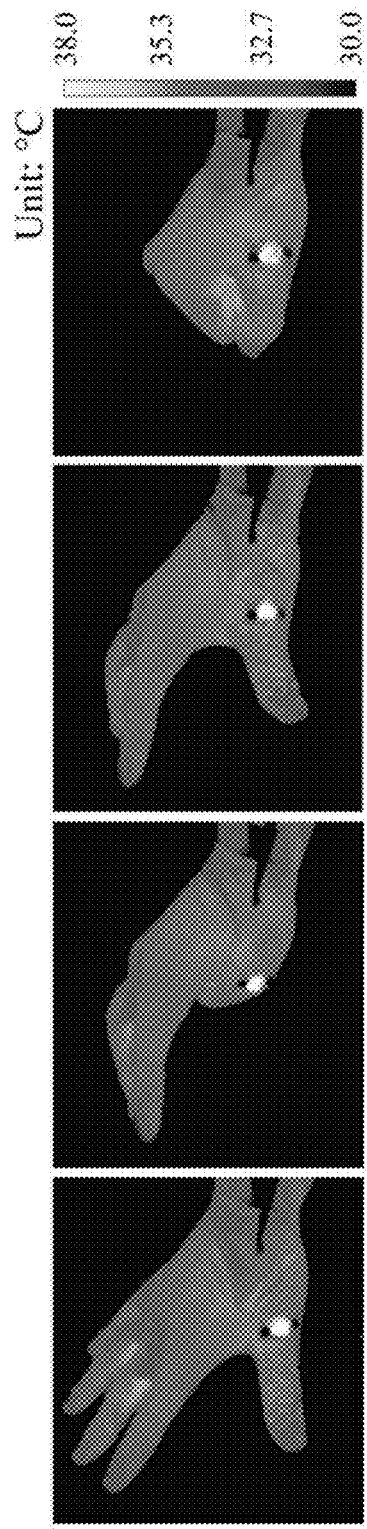
FIG. 20 is an illustration of examples of infrared images of an electric heater under different deformation modes, in accordance with various embodiments of the present disclosure.

One application for using the printed 1D nanomaterial is for thermal therapy. A wearable heater is a promising candidate for thermal therapy. In an experiment, Ag NWs printed fractal pattern of Peano curves were demonstrated as a flexible heater. In the fractal pattern, arc sections replace the sharp corners from the mathematically defined fractal layout to improve the elastic mechanics (e.g., flexibility and stretchability). In addition, the fractal pattern of Peano curves can have large area coverage. The footprint of the heater was 6×6 mm, as shown in FIG. 18. FIG. 18 also shows several consecutively captured infrared (IR) images during an ON-OFF cycle. During the ON stage, a uniform temperature distribution was observed around the Ag NWs pattern 303. FIG. 19 illustrates a plot of the time-dependent temperature profile of the heater at different voltages. The maximum temperature obtained was ~160° C. at the voltage of 25 V, with the maximum heating rate and cooling rate of 21 and 29° C. S$^{-1}$, respectively. The same heater pattern 303 was also directly printed on lab-use gloves to demonstrate the potential for wearable applications. The heaters exhibited stable heating performance when bent, stretched, and/or twisted. FIG. 20 shows the IR images of the heater under different deformation modes.

Figure 21:
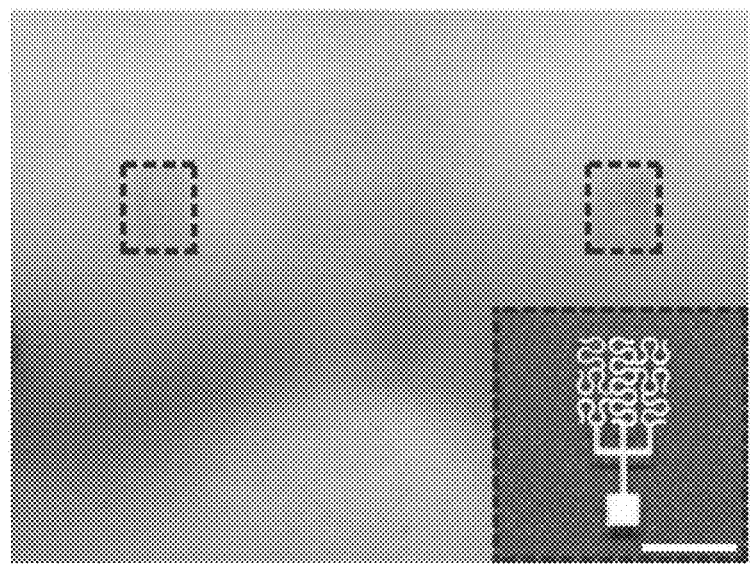
FIG. 21 is a photo of an example of printed AgNW-based dry electrocardiography (ECG) electrodes, in accordance with various embodiments of the present disclosure.
Figure 22:
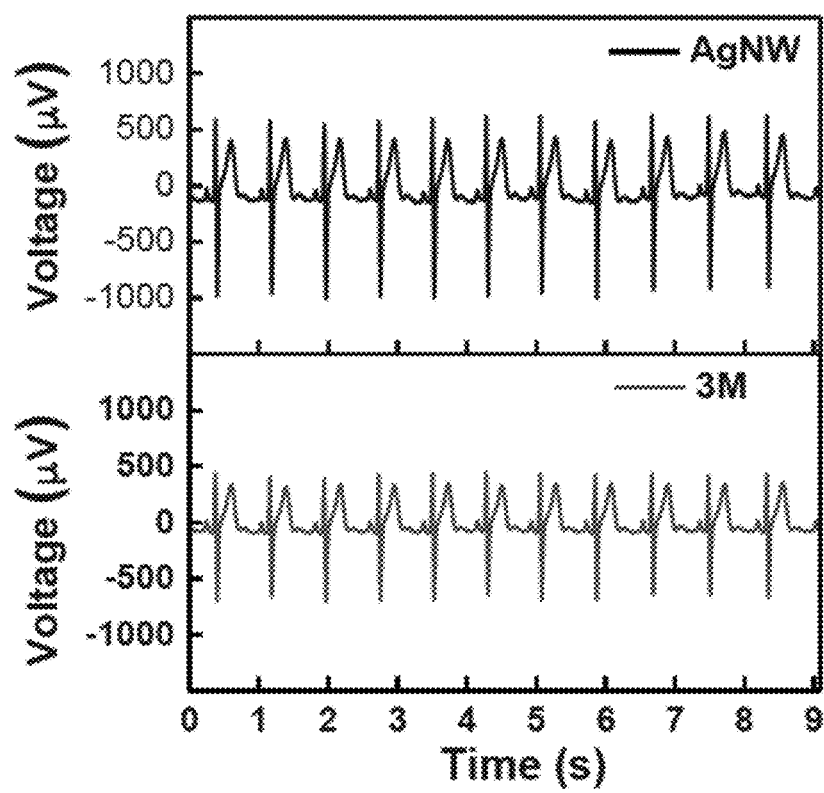
FIG. 22 is an example of an ECG signal captured from the printed AgNW dry electrode in comparison to the ECG signal captured from a wet electrode, in accordance with various embodiments of the present disclosure.

Dry ECG electrodes without the electrolytic gel layers as in the conventionally used wet electrodes have received significant interests for long-term health monitoring. Ag NW-based dry ECG electrodes have shown outstanding performances. Ag NWs were printed into a fractal pattern 303 of Greece Cross, which also can effectively release the local strain under stretching, on PDMS substrates 118 as the dry ECG electrodes. FIG. 21 illustrates a photo of an example of printed Ag NW-based dry ECG electrodes mounted on a chest with an inset showing a magnified image of an electrode. The PDMS substrate 118 has a thickness of 300 µm, enabling conformal contact between skin and conductive layer. As shown in FIG. 22, the ECG signal captured from the printed Ag NW dry electrode showed excellent performance compared to that obtained from the 3M wet electrode. Since the printed AgNW electrodes are "dry" (i.e., without the electrolytic gel that can cause skin irritation under long-term wear), they are suitable for long-term ECG monitoring.

The EHD technique of the present disclosure enables direct printing nanomaterials (e.g., AgNWs) on a diverse range of substrates 118, including, but not limited to PDMS, PET, glass, letter paper, nano-fiber paper, and polycarbonate filter (FIG. 2). In experiments, the printed nanomaterial patterns 303 were highly conductive (with conductivity as high as ~5.6×10$^6$ S/m). The printed line width was found to depend on several ink parameters and printing parameters, e.g., ink viscosity, nanomaterial (e.g., AgNW) concentration, stand-off, printing speed, voltage, nozzle size, and pressure. The ink properties and printing conditions were characterized to achieve the optimal printing performance. Post treatment was developed to remove polymer (e.g., PEO) residue and enhance the conductivity. A flexible heater was fabricated showing a uniform temperature distribution with a maximum heating rate of ~21° C. S$^{-1}$ and cooling rate of ~29° C. S$^{-1}$. The nanomaterial heater was also printed on lab-use gloves and showed stable heating performance under bending, stretching, and twisting. Printed AgNW dry ECG electrodes were able to collect accurate ECG signals, ideal for long term wearable applications. Fractal-inspired patterns, such as Peano curve and Greek cross, were used to improve the elastic mechanics of the AgNW devices.

Experiment Section for Example 1

Ink Preparation:

The nanomaterial ink 109 was obtained from mixing the Ag NW solution (AgNW concentration is 150 mg/ml in DI water) and PEO solution. The AgNW used had an average diameter of ~120 nm and an average length of ~25 µm. The PEO powder (Mv: 100,000) was purchased from Sigma-Aldrich. PEO powder was first diluted with DI water to form a PEO solution and then mixed it with AgNW solution and stirred for ten (10) minutes to achieve the AgNW inks with an AgNW concentration of 15 mg/ml and a PEO weight ratio of 4%.

Nanomaterial Pattern Printing:

Patterns 303 were first created by CAD software and then converted to the program code for printing. Printing parameters used were as following: nozzle inner diameter of 150 µm, printing voltage of 1500 V, standoff distance of 75 µm, PEO concentration of 4%, AgNW concentration 15 mg/ml, and back pressure of 0.4 psi. Printing speed varies from 1-10 mm/s for varies application.

Nanomaterial Pattern Post Treatment and Packaging:

Printed nanomaterial patterns 303 were first soaked in DI water for five minutes and then dried in oven at 50° C. This process was repeated three times for samples on dopamine-treated PDMS substrate 118 and six times for samples on glass substrate 118. Liquid metal (Gallium-Indium eutectic, Sigma Aldrich) and copper wires were used to form conformal electrodes, then covered with another layer of PDMS and cured.

Flexibility and Stretchability Characterization:

Nanomaterial patterns 303 were printed on PET and PDMS for bending and stretching test, respectively. Cyclic bending and stretching test was conducted on a custom-made testing stage 107. Four-point measurement was used to measure the sample resistance under cyclic loading using a digital multimeter (34001A, Keysight Technologies).

Measurement of Heater and the Test of the ECG:

For the measurement of the heater, a DC power was applied to the heater at the two external pads. IR thermometer (A655sc, FLIR) was used to measure the temperature distribution of the heater. For the ECG test, the as-fabricated electrodes were tested on PowerLab 4/25T (ADInstruments, Inc.) simultaneously with commercially available 3M wet ECG electrodes for comparison. One 3M electrode was used ground/reference electrode, two pairs of AgNW electrode and 3M electrode were attached to left and right chest, serving as positive and negative electrodes.

Example 2: Surface Modification of Elastomeric Substrates for Electrohydrodynamic Printing of Nanowires As demand for flexible and stretchable electronic devices increases, electrohydrodynamic (EHD) printing has become a promising fabrication method with high resolution and excellent scalability. However, EHD printing of silver nanowires (Ag NWs) on stretchable substrates 118 is affected by the surface properties of the substrates 118 and the interaction between the ink 109 and the substrates 118. The present disclosure includes two surface modification methods, UVO treatment and dopamine coating, to modify polydimethylsiloxane (PDMS) surfaces to achieve reliable and tunable EHD printing of nanomaterial nanowires (e.g., Ag NWs). The hydrophobic stabilities of the two surface modification methods and the effect of the modification methods including doses on EHD printing performances are investigated, such as resolution and conductivity of the printed patterns 303. The surface modification methods along with the proper printing conditions can be selected to tailor and optimize the printing performances. In experiments, an electronic tattoo based on fractal pattern of Ag NWs is printed on the modified PDMS substrate 118 to demonstrate the potential of the reported surface modification on reliable EHD printing of nanomaterial nanowires (e.g., Ag NWs) based stretchable devices.

Stretchable electronics is attracting significant attention as it enables a myriad of promising applications where electronic devices can undergo large deformation and/or form intimate contact with curvilinear surfaces. There are two main approaches for fabricating stretchable electronic devices. One is top-down microfabrication of inorganic materials, which has led to a variety of exciting stretchable devices such as epidermal electronics] and conformal bio-integrated electronics. The process typically involves photolithography, vacuum-based deposition techniques and etching, which can be complicated and relatively expensive. The other approach is based on the assembly of bottom-up synthesized nanomaterials. A plethora of nanomaterials have been explored for fabricating stretchable electronic devices showing excellent performances. However, a major challenge for this approach lies in facile, scalable and low-cost nanomanufacturing. Printed electronics refers to a type of electronics that are created by a variety of printing technologies. The key advantages of printed electronics include low-cost manufacturing with high throughput, compatibility with a wide range of substrates including flexible ones, and relative ease for heterogeneous integration. Extending printed electronics from rigid to flexible and stretchable substrates face challenges from the interaction between functional ink materials and substrates. The present disclosure addresses the challenges for printed stretchable electronics using silver nanowire (Ag NWs) and polydimethylsiloxane (PDMS) as the representative ink material and substrate 118, respectively.

Among the wide range of nanomaterials for stretchable electronics, metal nanowires in the form of random percolation network have shown excellent potential due to their high electrical conductivity and high stretchability. A number of methods have been used to print nanomaterials (e.g., Ag NWs) such as, for example, stencil printing, gravure printing, and screen printing. These template and mask based methods provide limited resolution in patterning and the required mask often reduces the flexibility and cost-effectiveness of these approaches. Non-contact printing methods such as ink-jet printing are maskless fabrication processes, however, they suffer from the low resolution. For inkjet printing, the size of the functional materials in the ink generally need to be less than 0.01 times the diameter of the nozzle to reduce the risk of nozzle clogging. Considering that the length of Ag NWs is typically >10 μm, high-resolution features is usually difficult for inkjet printing. On the other hand, EHD printing can solve the resolution limitation due to its special printing mechanism that can print features much smaller than the nozzle diameter. As a result, a larger nozzle can be selected to avoid nozzle clogging, while still capable of producing high-resolution features. Typical EHD printing system uses electric fields rather than thermal or acoustic energy to produce the ink flow. EHD printing has been used to print various functional materials, such as conductors, semiconductors and insulators.

PDMS is one of most widely used materials in the fabrication of stretchable electronics. However, PDMS is hydrophobic with a low surface free energy (21-25 mJ·m$^{-2}$), resulting in relatively poor intrinsic adhesion between PDMS and the ink of functional materials. A few surface modification approaches, such as corona discharges, plasma treatment, UV-Ozone (UVO) treatment and dopamine coating have been used to modify the PDMS surface to enhance the adhesion between the ink and the substrate. Among these approaches, UVO treatment is a method to change the chemical properties of the PDMS surface without influencing much of its bulk properties, while dopamine coating is a trending modification method to apply a pre-coating on the PDMS surface to change the surface properties. However, the effect of these surface modifications on EHD printing, especially of Ag NWs, has not been investigated.

The present disclosure includes an analysis of the effect of two surface modification methods of a substrate 118 (e.g., PDMS substrate), UVO treatment and dopamine coating, on the EHD printing behavior of conductive Ag NWs inks. Different treatment doses were applied to analyze their influence on the interface behavior between the substrate 118 and the nanomaterial ink 109. The modified substrate surface was characterized by dynamic contact angle measurement. The advancing and receding contact angles between the ink 109 and the substrate 118 were reduced by both modification methods. Enhanced by the surface modification, complex patterns 303 can be reliably printed, with a resolution as high as 50 μm. Printed Ag NWs on the dopamine-coated PDMS surfaces demonstrated better resolution and lower line edge roughness than that on the UVO-treated PDMS surfaces. With the facile surface modification strategy, diversiform featured patterns could be achieved by not only adjusting the printing parameters but also distinguishing surface treatment doses. Attributed to the high electrical conductivity of Ag NWs and the outstanding adhesion at the interface, the printed patterns exhibited low sheet resistance. Furthermore, a complex conductive pattern printed on PDMS was integrated into an electrical circuit with light emitting diode (LED) light and power source to demonstrate its application in stretchable wearable devices.

Results and Discussion

For EHD printing, the wetting property of the ink 109 on a specific substrate 118 plays a significant role in printability and printing resolution. Typically, the more wettable the surface is, the better adhesion is achieved between the ink 109 and the substrate 118. If the ink 109 does not wet the surface, the ink 109 adheres poorly onto the substrate surface, leading to poor printing performance. On the other hand, too high wettability makes the ink 109 easily spread on the substrate surface and reduces the achievable printing resolution. Untreated PDMS shows strong hydrophobic properties with low surface energy, hence the Ag NWs/PEO ink 109 has poor adhesion to PDMS's surface. The ink 109 cannot settle well on the PDMS substrate 118 and the printing performance is unsatisfactory. Thus, surface modification for PDMS films is a prerequisite to change the hydrophobic PDMS surface to the hydrophilic surface for EHD printing.

Figure 23:
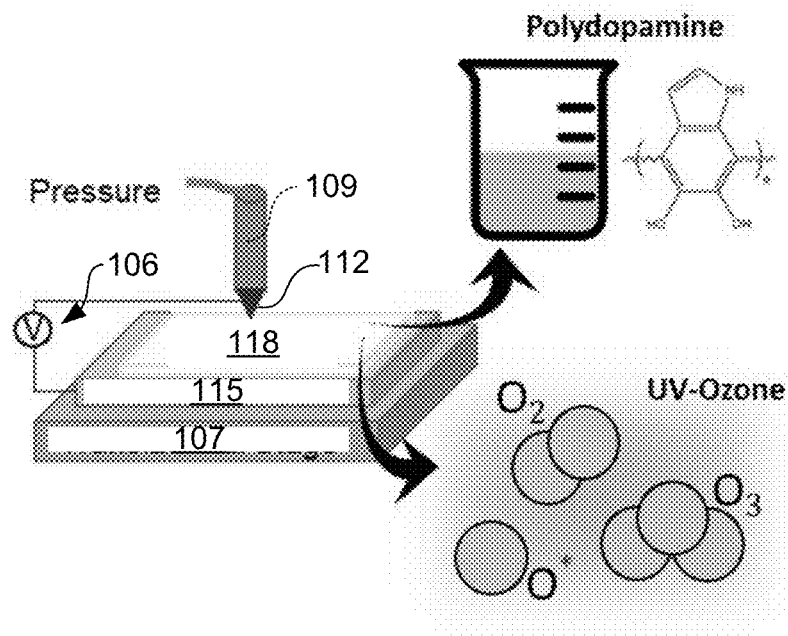
FIG. 23 is another example of a schematic of a printing system with a surface treatment, in accordance with various embodiments of the present disclosure.

According to various embodiments, two substrate surface modification approaches was studied, which were UVO treatment and dopamine coating. UVO treatment and dopamine coating have different surface wettability enhancing mechanisms. For UVO treatment, an oxidation layer of several to hundreds of nanometers is formed, and this silica-like layer enhances the adhesion between PDMS and other polar agents (e.g., printed inks). For dopamine coating, the dopamine coated on PDMS surface is oxidized in air to polymerize and apply a polydopamine monomolecular layer on the PDMS surface. Catechol groups of polydopamine has strong interaction with various functional groups to enhance the adhesion between them. The surface treatment for PDMS and EHD printing setup is schematically illustrated in FIG. 23.

Contact Angle

The contact angle is conventionally measured to quantify the wettability of a liquid on a solid surface. To study the phenomena of dynamic ink and substrate interaction, the dynamic contact angles need to be measured, which are referred to advancing contact angle, $\theta_A$, and receding contact angle, $\theta_R$. The advancing angle is more associated with the low surface energy regions and the receding angle is associated with the high surface energy regions on heterogeneous polymer surfaces. The advancing contact angle, $\theta_A$, is measured when increasing the contact area between the liquid and the solid, while the receding contact angle $\theta_R$ is measured when decreasing the contact area between the liquid and solid interfaces. Both the advancing contact angle, $\theta_A$, and receding contact angle, $\theta_R$ can possibly affect the EHD printing process. When starting the EHD printing process, the ink 109 is extruded from the nozzle 112 to the substrate 118, thus $\theta_A$ is essential at the moment when the ink 109 contacts the substrate 118. Then the ink meniscus and Taylor cone are formed, and the ink 109 is transferred to the substrate 118 as stage moves. The ink settlement on the substrate 118 will be largely affected by the receding contact angle, $\theta_R$. The measurement of these two contact angles provided a brief indication of the adhesion between AgNWs/PEO ink 109 and PDMS surfaces under different UVO or dopamine modification.

Figure 24A:
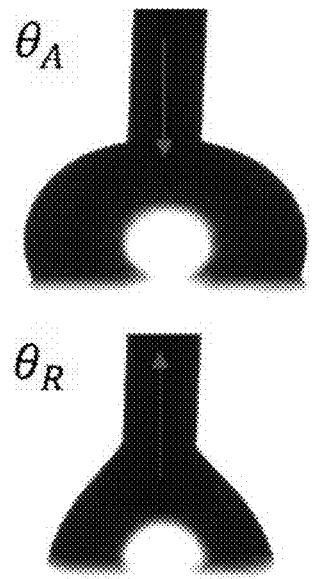
FIG. 24A illustrates optical images of the advancing angle and the receding angle of ink droplets on the surface of an untreated substrate, in accordance with various embodiments of the present disclosure.
Figure 24B:
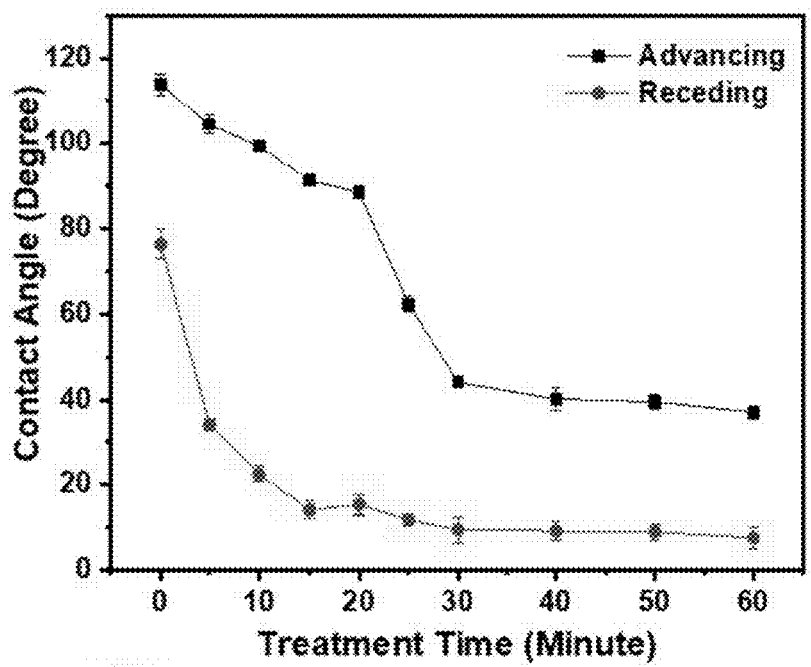
Figure 24C:
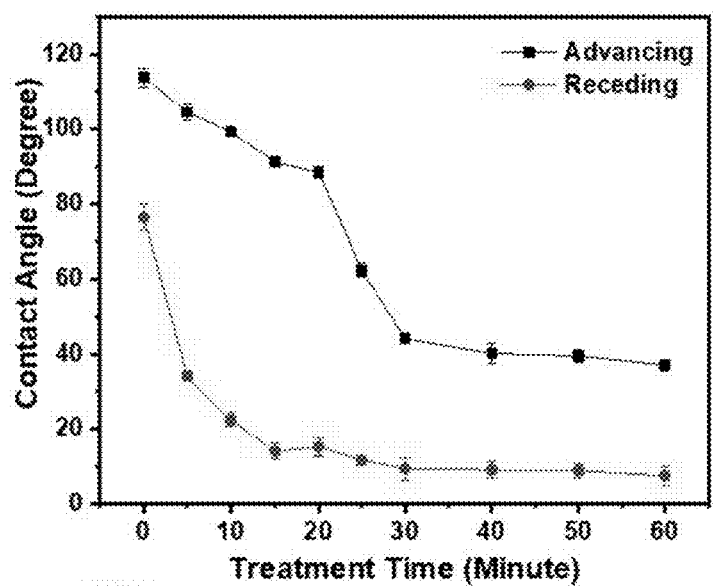

FIG. 24A shows the optical images of the advancing angle, $\theta_A$, and receding angle, $\theta_R$, of AgNWs/PEO ink droplets on the surface of untreated PDMS. The advancing contact angle of the untreated PDMS was 113.7° and the receding angle was 76.4°. FIG. 24B shows the measurement results of the advancing and receding contact angles $\theta_A$ and $\theta_R$ of AgNWs/PEO ink on UVO treated PDMS substrates as a function of UVO treatment time. It can be observed that as the UVO treatment time increased, the initially hydrophobic PDMS substrate 118 became hydrophilic. Both $\theta_A$ and $\theta_R$ decreased significantly when the PDMS substrates 118 were exposed to ≤30-minute UVO exposure, and then the contact angles became relatively stable with further exposure. FIG. 24C shows the measured $\theta_A$ and $\theta_R$ of AgNWs/PEO ink 109 on polydopamine coated PDMS substrates as a function of soaking time. The dynamic contact angles $\theta_A$ and $\theta_R$ decreased with dopamine treatment time increased and the equilibrium of dynamic contact angles were larger than the contact angles from the UVO treated PDMS, especially for the advancing angle $\theta_A$. Receding contact angle became relative stable on PDMS when treatment time ≥10 min, while advancing contact angle decreases continuously as treatment time increasing.

Figure 24D:
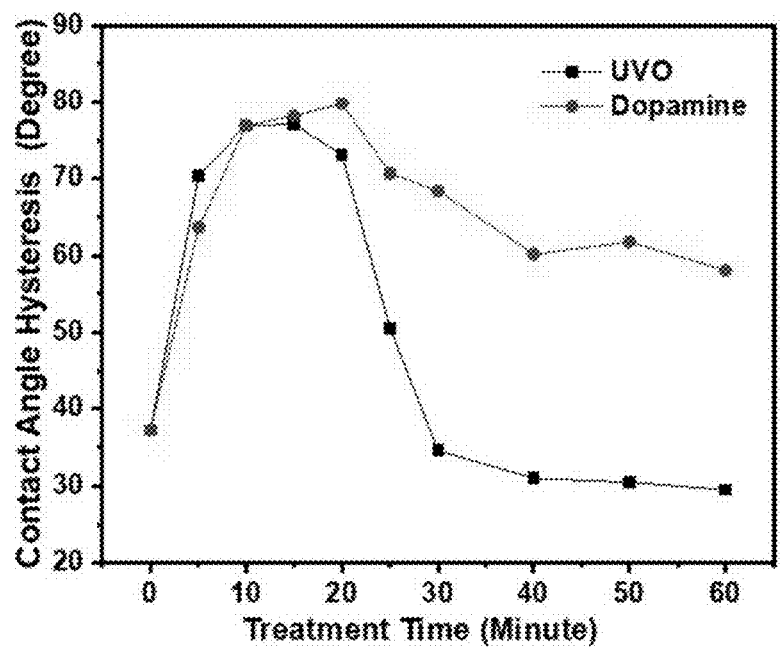

Contact angle hysteresis (CAH) is the difference between the advancing and the receding contact angle. It is widely recognized that chemical or topographical heterogeneities of the substrate are the main sources of CAH. The higher heterogeneity, larger surface roughness and/or higher molecular mobility, the higher the CAH is. FIG. 24D illustrates the CAH as a function of treatment time of UVO treated and dopamine treated substrate 118. The initial increase of CAH for UVO treated samples indicates that the surface became more heterogeneous. This was attributed to the surface damage caused by chain scission reaction. The surface of PDMS was only partial oxidized and the region with higher surface energy contributed to the rapid drop of the receding contact angle before 20-minute treatments (circle dotted curve in FIG. 24A). The reduced hysteresis at longer exposure time from 15 minutes to 30 minutes came from the formation of a cross-linked silica-like structure.

The fast and complete surface oxidation occurred at this time led to the dramatic drop of advancing contact angle from 20-minutes to 30-minutes (square dotted curve in FIG. 24A), owing to the reduction of low surface energy region. For 30 minutes and longer, the CAH trended to be steady at a low hysteresis, indicating a homogeneous surface consisting of completely formed silica-like structure. For the dopamine treated samples, the CAH showed a trend of rising first and then slightly decreasing.

The initial rapid increase was because the partially coated polydopamine reduced the surface homogeneity. When the soaking time was beyond 20 minutes, the hysteresis slightly decreased and became steady at a higher CAH value than that of the UVO treated samples. Longer treatment time led to complete coating of polydopamine and decreased the surface heterogeneity.

Based on the above observations, the best UVO treatment time for printing Ag NWs/PEO ink on PDMS is around 30 minutes because of the low dynamic contact angle and the small CAH. For dopamine treatment, the soaking time of printable substrate started at about eight minutes according to the printing experiments, where applicable ratio of polydopamine layer started to form and receding contact angle reduced significantly. As the soaking time increased, continuous lines could be printed within a wide window of soaking time between about 8 minutes to 60 minutes, because the formation of a stable polydopamine monolayer ensures desirable adhesion of the ink to the substrate.

Hydrophobic Stability

Besides the resulting contact angles of the treatment approaches, the stability of the treatment also affects the printing process, as it determined the shelf life of the treated sample. To evaluate the printing performance, good hydrophobic/hydrophilic stability is required for the substrates 118, since the stable surface wettability during printing ensures consistent and repeatable printing performance.

Figure 25A:
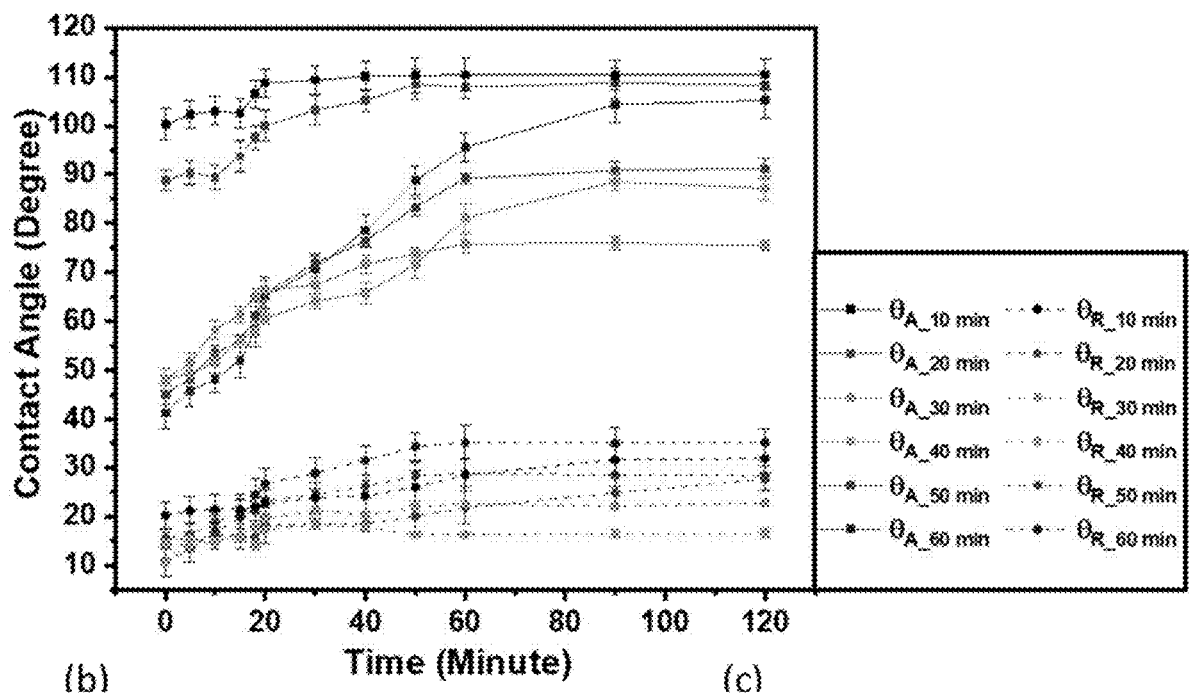
FIGS. 25A-C illustrate plots of the contact angle versus aging time for a modified substrate, in accordance with various embodiments of the present disclosure.

Although the UVO treatment is very effective in changing the PDMS films from hydrophobic to hydrophilic, many studies observed hydrophobic recovery after UVO exposure, indicating a reversing trend of the contact angle gradually after treatment. The hydrophobic stability of the UVO and dopamine treated surfaces were evaluated by measuring the contact angles $\theta_A$ and $\theta_R$ of the samples at certain aging time (about 5 to 120 minutes) after treatment, the results of which were plotted in FIGS. 25A and 25B.

Figure 25B:
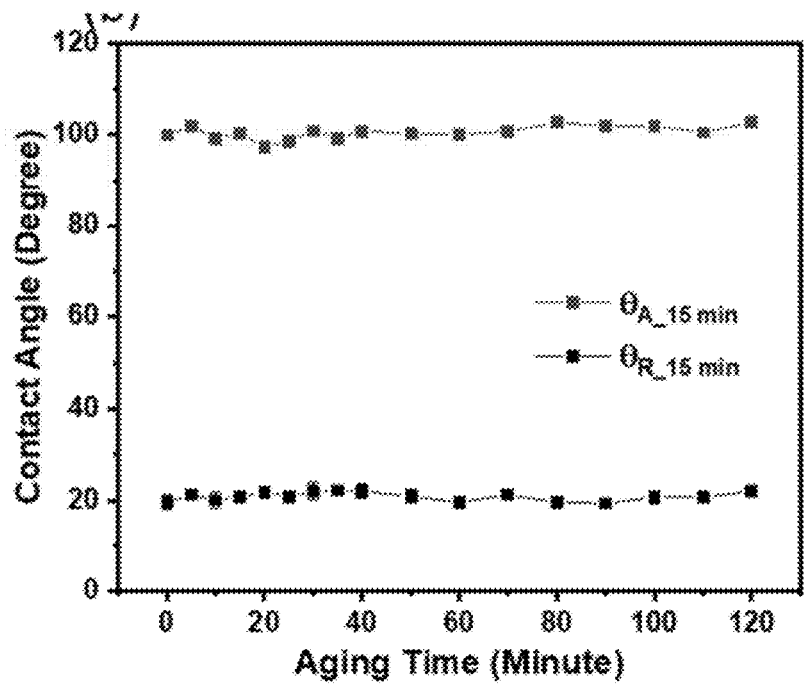
Figure 25C:
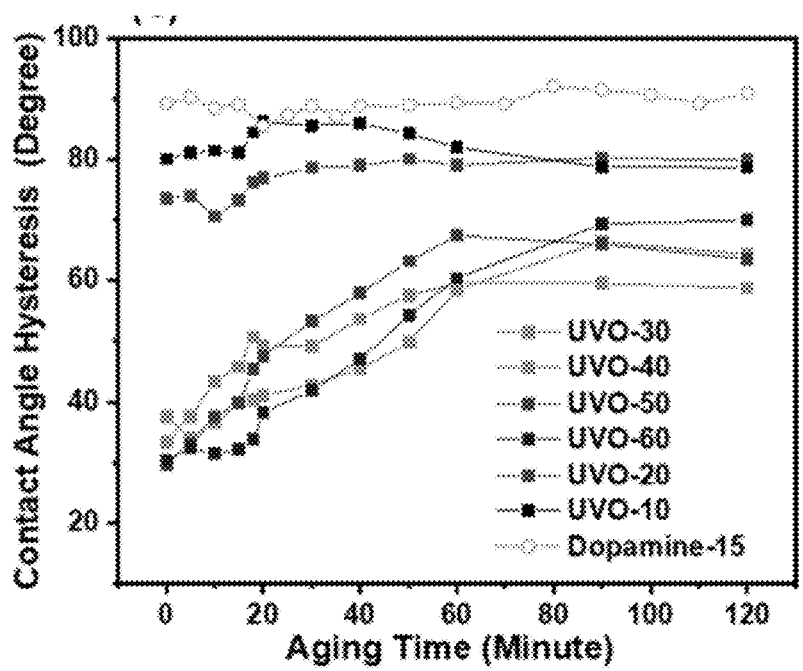

For UVO treatment, all the samples demonstrated certain level of hydrophobic recovery. For small dose UVO treatment (exposure time ≤20 min), $\theta_A$ and $\theta_R$ of the surfaces exhibited small changes as the aging time increased (FIG. 25C). It has been suggested that lower doses of UVO treatment results in the gradual formation of a liquid-like layer, consisting of free oligomeric PDMS on top of the partly oxidized PDMS surface. The hydrophobic recovery in this time zone is due to the reorientation of polar groups formed by partial oxidation. The results of contact angle hysteresis as a function of aging time in FIG. 25C showed that there were only slightly change in CAH with increasing aging time, meaning that the heterogeneity nearly unchanged. This is because no silica-like structure formed yet. On the other hand, high dose UVO treatment (exposure time ≥30 min) showed significant hydrophobic recovery. The treated surfaces exhibited a rapidly increasing hydrophobicity with increasing aging time after exposure. The dominating mechanism for this hydrophobic recovery is believed to be the migration of free siloxanes from the bulk to the silica-like surface through surface cracks. The fact that CAH changes with aging time supported this mechanism. The ascending hysteresis for treatment time over 30 minutes shown in FIG. 25C explicated that the surface changed from being homogeneous to heterogeneous during the aging time, i.e., the migration of siloxanes to the surface reduced the homogeneity of silica layer. From the experimental results shown in FIG. 25A, the effect of hydrophobic recovery stabilized after about 90 minutes. Based on such aging results, the treated samples were used for printing two hours after treatment to ensure the surface properties were stabilized.

Dopamine-coated samples showed stable hydrophilic property without evident hydrophobic recovery. FIG. 25B shows the hydrophobic stability of the sample treated fifteen minutes in dopamine solution, indicated by the almost constant contact angle irrespective of the aging time. CAH results from FIG. 25C also exhibited that there was no significant change in surface heterogeneity during aging time. To summarize, dopamine coating can ensure the hydrophobic stability of the treated sample, while the UVO treatment needs to be optimizes to determine the proper treatment time to balance the requirement of the hydrophobic properties and the shelf life of the sample for EHD printing.

Effect of Treatment Conditions on EHD Printing

For EHD printing, the wetting property of the ink 109 on a specific substrate 118 plays a significant role in printability and printing resolution. Highly hydrophilic sample will reduce the printing resolution due to the ink spreading, while highly hydrophobic sample will make reliable ink settlement on the substrate very difficult. In this study, conductive lines were printed on the PDMS surface with different UVO exposure or dopamine coating time to find the proper treatment time of UVO and dopamine treatment for EHD printing. These conductive lines were also printed with different printing speed to study the effect of the speed on the resulting line width. In general, the printed linewidth decreases as printing speed increases (FIGS. 26A and 26B), while too high printing speed resulted in discontinuous line (>10 mm s-1).

Figure 26A:
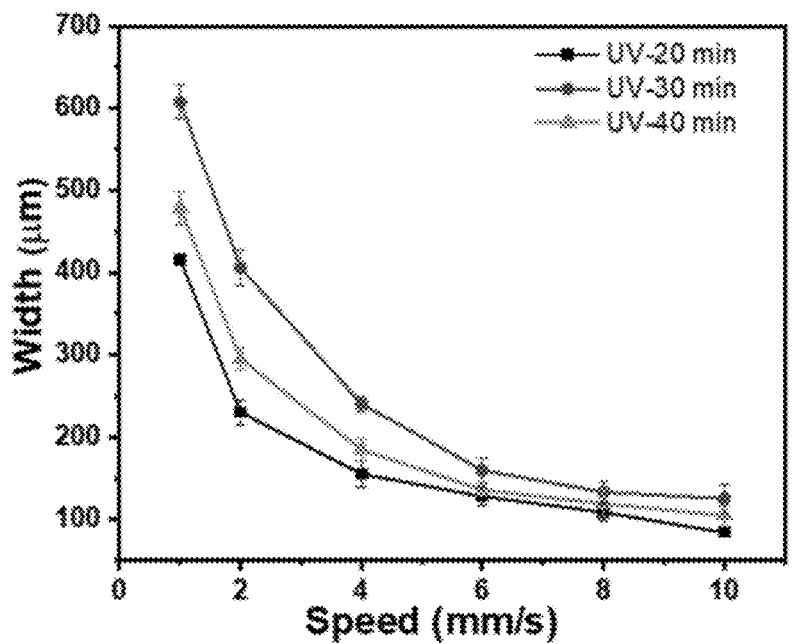
FIGS. 26A and 26B illustrate plots of the measured line widths versus different printing speeds for treated substrates, in accordance with various embodiments of the present disclosure.
Figure 26B:
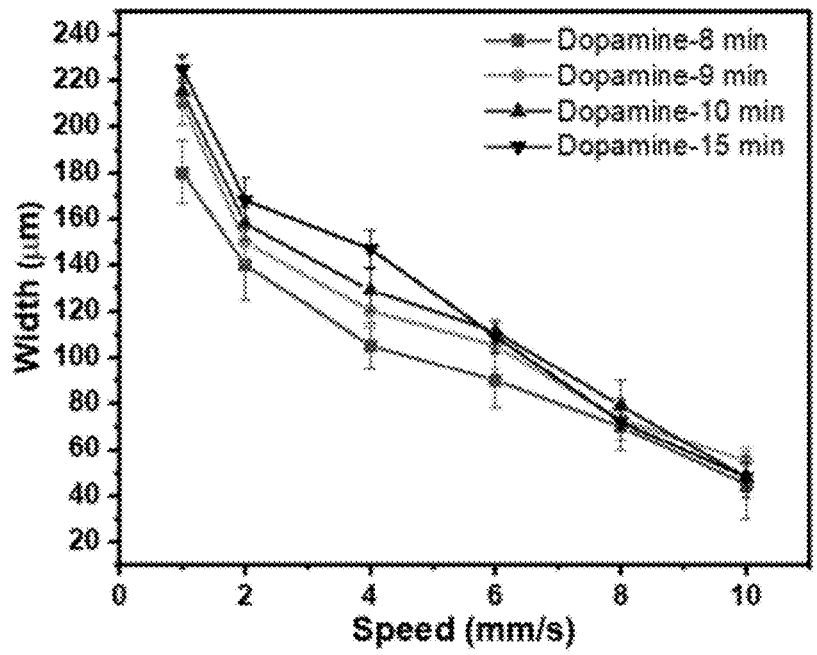

In the case of UVO treatment, if the exposure time was too short (<about 20 min), the sample had relatively large contact angle. The ink had poor adhesion to the PDMS surface, and the printed line exhibited very poor uniformity and discontinuity. When the exposure time was too long (>40 min), the sample still had large contact angle after an aging time due to hydrophobic recovery, which again resulted in non-continuous lines. Only proper UVO treatment time (from about 20 to 40 min) led to suitable surface property for good printing performance. FIG. 26A shows the width of printed Ag NWs/PEO lines on PDMS with different UVO exposure time (from 20 to 40 min) as a function of printing speed (from 1 to 10 mm s$^{-1}$). Clearly at each given speed, longer UVO exposure resulted in wider line width, due to the higher wettability and larger ink spreading on the sample. Moreover, the line width or printing resolution was also affected by the printing speed. In the feasible speed range, higher printing speed resulted in smaller line width and better resolution.

For dopamine-coated PDMS surfaces, good hydrophobic stability was obtained, as shown in FIG. 25B. A few printing experiments were performed on PDMS substrates 118 with different dopamine treatment time. During experiments, when the dopamine treatment time was less than about eight minutes, continuous lines could not be printed on the PDMS substrates 118, which is due to the high contact angles between the ink 109 and the PDMS surfaces. When the PDMS substrates 118 were treated with dopamine larger than fifteen minutes, contact angles were pretty much stabilized. Here, dopamine treatment times from eight to fifteen minutes were used to study their effect on EHD printing FIG. 26B. At the same printing speed, the linewidth increased as the dopamine treatment time increases. While with same dopamine treatment time, the linewidth decreased as the printing speed increases. Thus, two alternative parameters, printing speed and treatment time, can be changed to obtain the desired printing resolution. According to various embodiments of the present disclosure, the shortest proper dopamine treatment time for EHD printing was eight minutes, and the narrowest line width obtained in this situation was ~50 μm.

Characterization of Printed Conductors

Figure 27A:
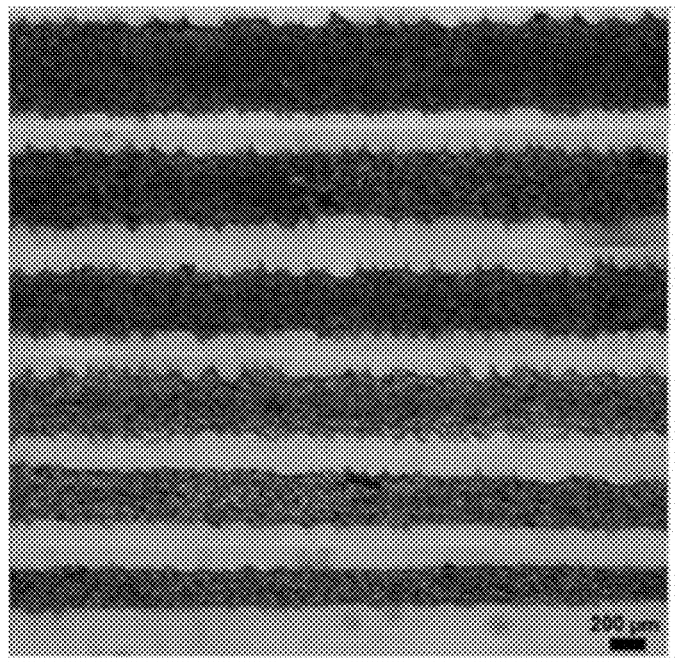
FIGS. 27A and 27B illustrate optical images of lines under different printing speeds on modified substrates, in accordance with various embodiments of the present disclosure.
Figure 27B:
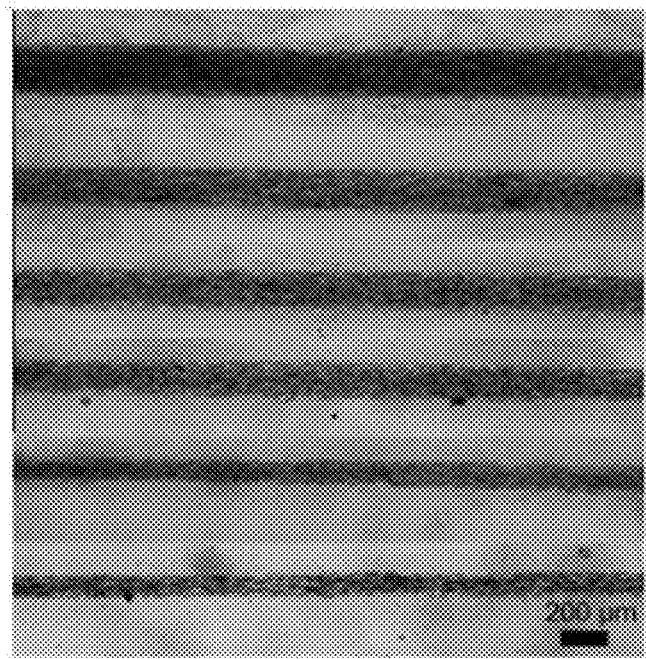
Figure 27C:
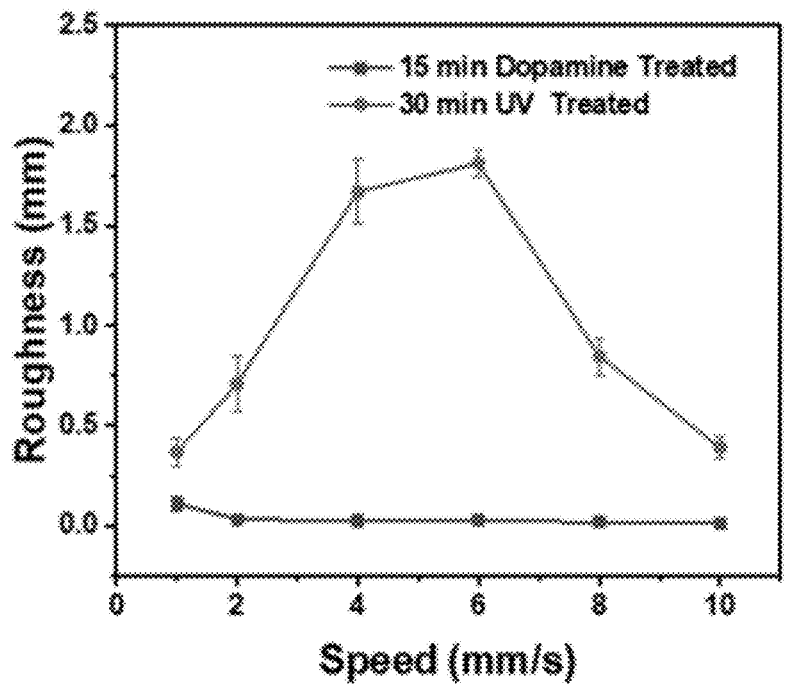
FIGS. 27C-27G illustrate plots associated with different factors (e.g., roughness, sheet resistance, thickness) with different printing speeds for the different types of modified substrates, in accordance with various embodiments of the present disclosure.

The morphology and electrical properties of the printed patterns 303 affect the device performance in practical applications such as interconnectors and electrodes. PDMS substrates 118 with 30-minute UVO exposed and 15-minute dopamine treated respectively are chosen as the substrate 118 to print conductive lines for electrical and geometry properties evaluation. Ag NWs lines with different printing speeds were printed and then their line width, resistance and thickness were measured. Sheet resistance and conductivity of these lines were calculated according to the measured parameters. These results were shown in FIGS. 27A-G. From the optical microscope images of the printed lines on UVO and dopamine treated PDMS (FIGS. 27A and 27B), clearly much rougher line edges were observed for the UVO treated samples. Moreover, the printing resolution of the UVO treated samples was generally much worse than that of the dopamine treated samples. Compared to the substrates 118 treated by UVO for 30 minute (abbreviated as UVO-30), the substrates 118 treated by dopamine for 15 minute (abbreviated as Dopamine-15) resulted in printed lines with better uniformity, higher resolution and lower edge roughness. The edge roughness measured by Image J in FIG. 27C shows that the patterns on Dopamine-15 exhibits very low edge roughness within the feasible range of the printing speed, while the patterns on UVO-30 show much higher edge roughness, especially when the printing speeds are 4 mm·s$^{-1}$ and 6 mm·s$^{-1}$. The non-uniform rough edges may be caused by the too-small contact angle and the uneven hydrophobic recovery of the surface.

Figure 27D:
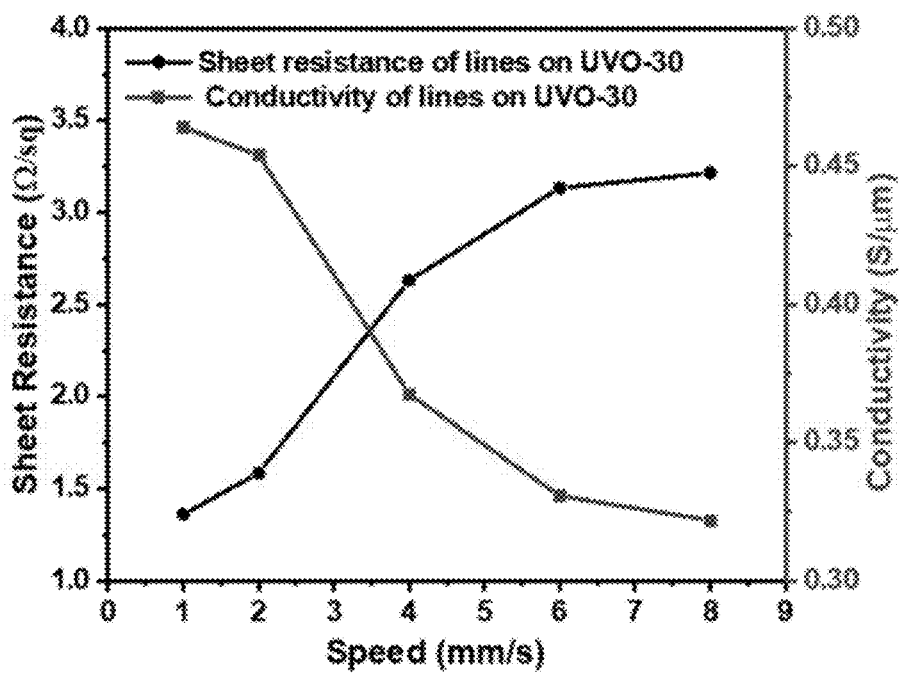
Figure 27E:
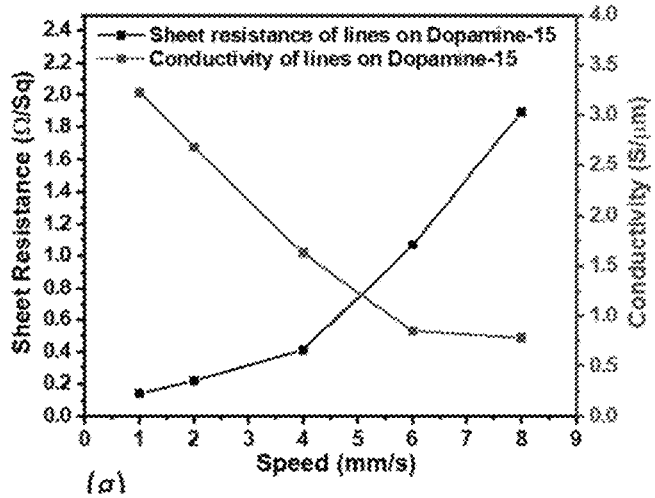
Figure 27F:
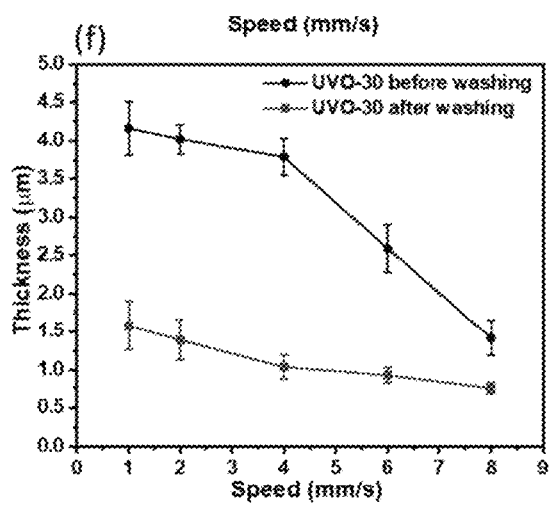
Figure 27G:
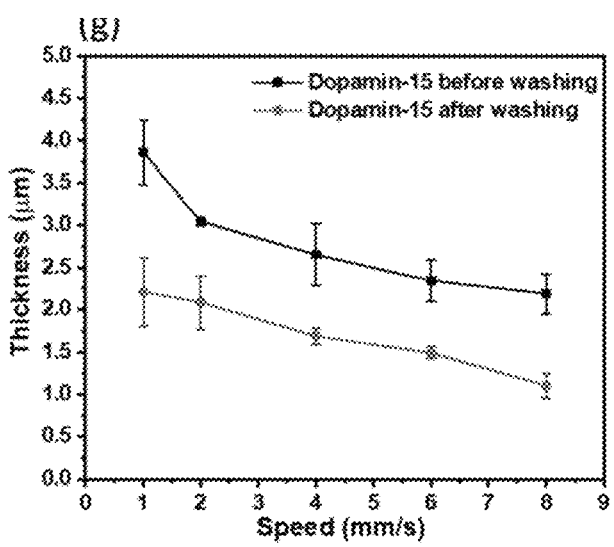

To measure the sheet resistance (Rs) of each line, a typical 4-probe method was used to measure the resistance (R) of these printed lines and Rs was calculated by Rs=RW/L where W and L are the width and measured length of the lines, respectively. Derived from R=L/σA, where a is the conductivity, Rs can also be expressed as Rs=1/σt, where t is the thickness of the printed pattern. The sheet resistance only associates with the conductivity and the thickness of the pattern. As shown in FIGS. 27D and 27E, for patterns on UVO-30 and Dopamine-15 at each printing condition, the sheet resistance (black curves) increases monotonically with the increase of printing speed. Compared to Dopamine-15, the printed lines on UVO-30 showed higher sheet resistance. The conductivity of the printed patterns (red curves) were shown with the right coordinate axis in FIGS. 27D and 27E. As expected, the conductivity decreased when increasing the printing speed and the patterns on UVO-30 showed much lower conductivity than that on Dopamine-15 at all speeds. FIGS. 27F and 27G show the comparison test results of the feature thickness before and after water soaking based post-processing with different printing speeds for patterns on UVO-30 and Dopamine-15 respectively. The line thickness decreased with the increase of the printing speed in both cases due to the reducing of the loaded ink at a higher speed. Moreover, although the line thickness before post-processing was comparable between patterns on UVO-30 and Dopamine-15, the line thickness dropped dramatically after post-processing for lines on UVO-30, which indicated that the Ag NWs on the patterns might be washed away by a larger amount on UVO treated substrate. The reduced line thickness decreased the conductivity of these printed lines. Thus, the lower conductivity and the thinner thickness of patterns both contributed to the high sheet resistance for lines on UVO-30. To summarize, the printed lines on UVO-30 showed larger line width and thinner film thickness with higher roughness edges, while the printed lines on Dopamine-15 provided high resolution features with smaller line width, thicker film, and smoother line edges.

Fractal Structure Printing

Figure 28A:
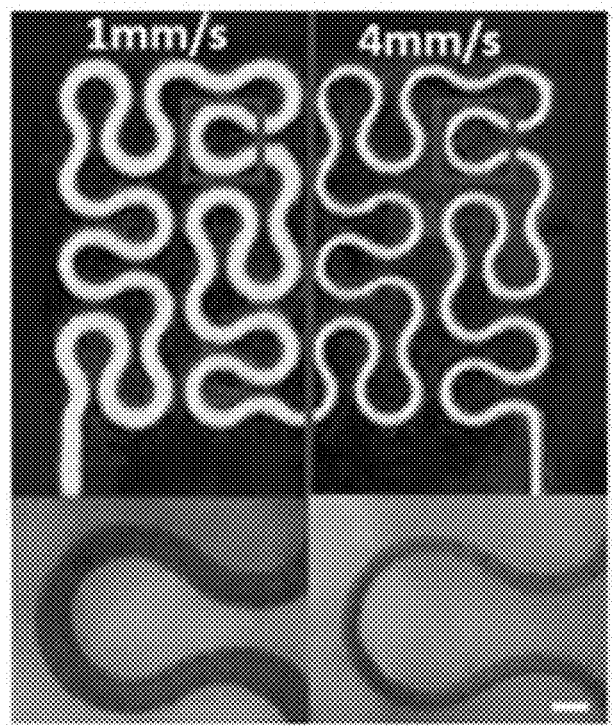
FIGS. 28A-28G illustrate different images of the printed AgNW dry electrodes printed on the different modified substrates, in accordance with various embodiments of the present disclosure.
Figure 28B:
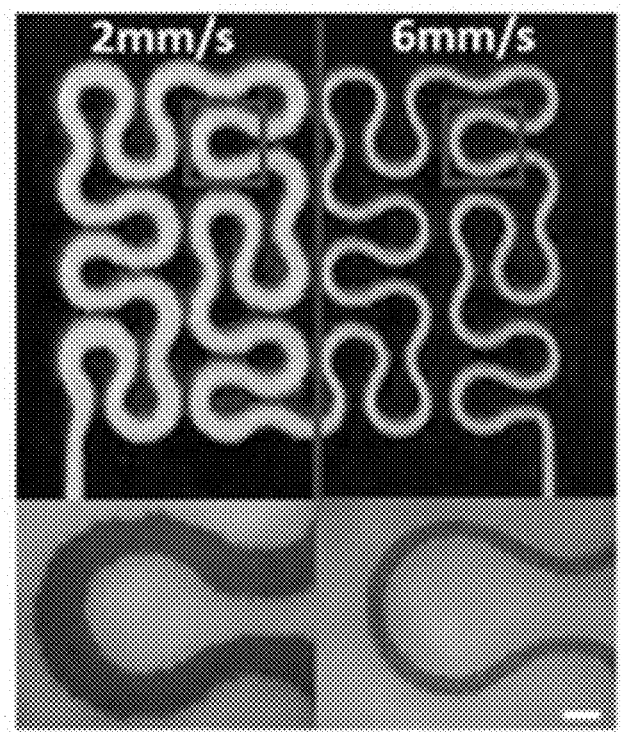
Figure 28C:
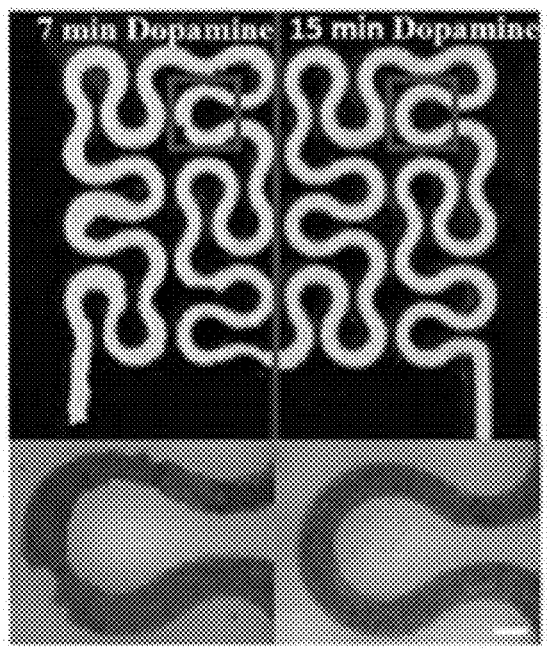
Figure 28D:
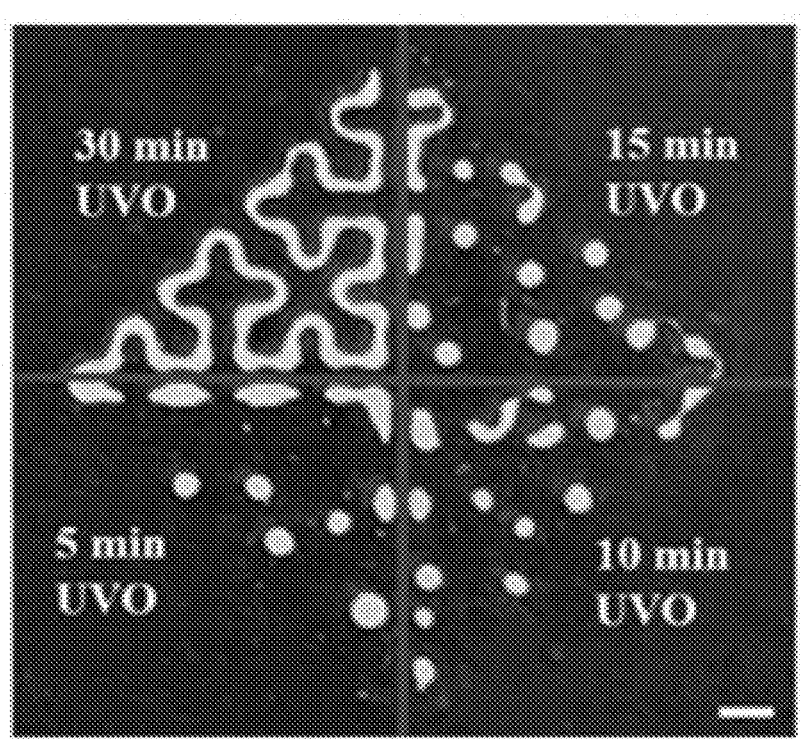

After PDMS surface treatment, arbitrary patterns (e.g., fractal patterns) can be directly printed on the PDMS substrates using EHD printing. Both the surface treatment and printing speed can be used to regulate the printing results, such as line width. To show how printing speed affects printing performance, two PDMS substrates were treated 15 minutes by dopamine and 30 minutes by UVO separately. The Peano curves were then printed with two speeds (half curves at 1 mm·s$^{-1}$ and half at 4 mm·s$^{-1}$) on a dopamine treated PDMS substrate (FIG. 28A), and then at 2 mm·s$^{-1}$ and 6 mm·s$^{-1}$ on UVO treated PDMS substrate (FIG. 28B). Clearly different line width was obtained using different printing speed. Surface treatment time also had a significant effect on printing performance. Peano curve was printed on a dopamine treated substrate with one region treated by seven minutes and the other region by fifteen minutes separately. The pattern printed on seven minutes treated region was nonuniform as shown in FIG. 28C. For UVO treatment, a PDMS film was divided into four regions, which were treated by 5 min, 10 min, 15 min, and 30 min separately. Clearly from FIG. 28D, only the properly treated regions (i.e., 30 min UVO exposure) was printable with continuous features.

Figure 28E:
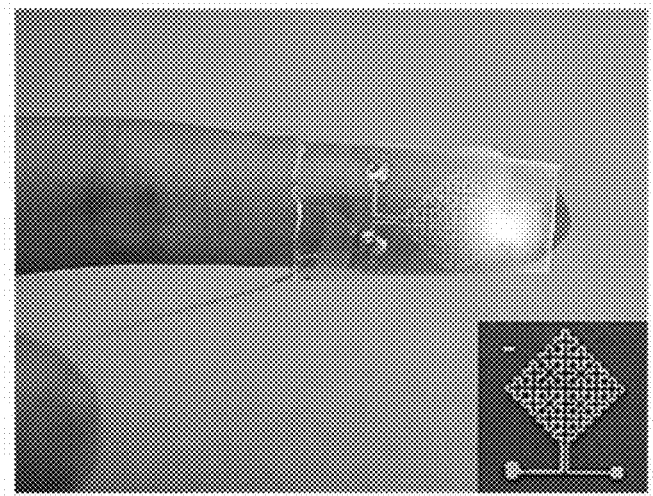
Figure 28F:
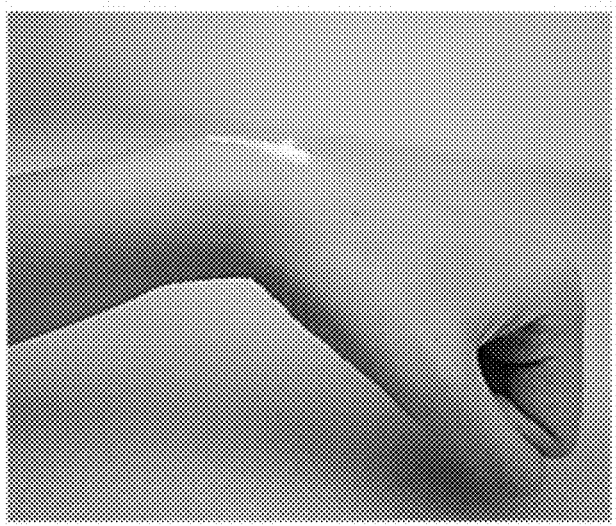
Figure 28G:
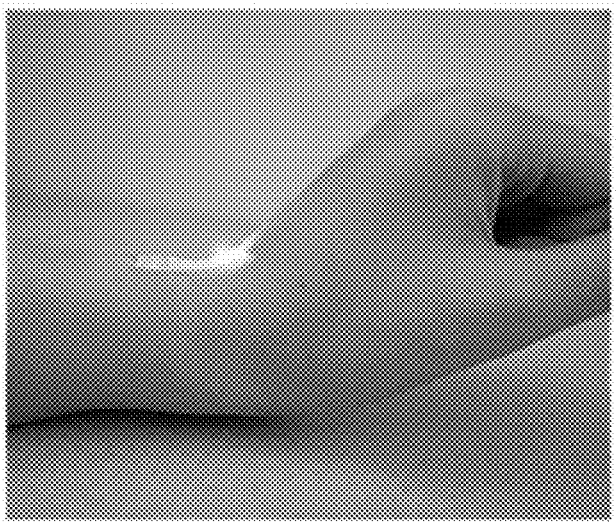

A fractal pattern of Sierpinski square was printed using Ag NWs ink as a tattoo for wearable electronics. In the fractal pattern, the sharp corners are rounded from the mathematically defined fractal layout to improve the elastic mechanics. PDMS films with 15 min dopamine treatment were chosen as substrates here, due to the low roughness, good continuity and uniformity of printed features. A LED light was inserted into Ag NWs printed Sierpinski pattern. As shown in FIG. 28E, the tattoo electronic maintained its functionality under bending and stretching. The printed tattoo electronic can be easily attached to the skin or curved objects. FIG. 28F shows the tattoo electronic attached to the wrist and keeps lighting the LED during wrist bending forward and backward. The stretchability of PDMS and the fractal design of printed patterns help the tattoo electronic bear the tension while the wrist bending.

The present disclosure relates to high-resolution and scalable printing of Ag NWs patterns on PDMS with two surface modification methods, UVO treatment and dopamine coating, which made the PDMS films suitable for EHD printing using Ag NWs/PEO ink. The effect of the two surface treatment methods, surface treatment time and printing speed on the performances of EHD printing are discussed. It was found that the proper UVO treatment time (about 20 to 40 min) and dopamine treatment time (about 8 min to 15 min) were important to ensure reliable EHD printing. The different surface treatment and printing conditions led to differences in printing resolution and electrical properties such as sheet resistance and conductivity of the printed features. Tattoo electronics was demonstrated by EHD printing of Ag NWs on the properly treated PDMS substrate, and a fractal inspired pattern, Sierpinski curve, was printed to improve the elastic mechanics of Ag NWs based devices. The reported surface modification methods are expected to play an important role in facilitating high-resolution and scalable printing of nanomaterials for flexible and stretchable electronics.

Experimental Section for Example 2

Preparation of Ag NWs/PEO Ink:

Ag NWs were synthesized by modified polyol process as the conductive material in the ink for EHD printing with an average diameter of ~120 nm and an average length of ~20 μm. After synthesized, the Ag NWs were suspended in ethanol for ink preparation. The PEO powder (Mv: 1 000 000) purchased from Sigma-Aldrich was first diluted in DI water to form a clear PEO solution. Then the PEO solution was mixed with Ag NWs solution to tune the ink viscosity. Proper selection of PEO and Ag NWs concentration in the ink is very important for the printing performance. Too high PEO and Ag NWs concentration both may cause nozzle clogging and result in discontinuous printing. On the other hand, low PEO concentration in the ink leads to insufficient viscosity for reliable printing, while low Ag NWs content in the ink causes low conductivity of the printed pattern. In the experiments of the disclosure, a 4 wt % PEO solution was chosen and mixed with Ag NWs with a concentration of 25 mg·ml$^{-1}$ to form the conductive Ag NWs ink.

Preparation and Surface Modification of PDMS Substrate:

PDMS was prepared using the Sylgard 184 Silicone Elastomer Kit with a typical mass ratio 10:1. Liquid mixed PDMS was degassed in vacuum to remove air bubbles and then spin-coated on a clean glass slide to form a flat film. The film was cured at 80° C. for three hours to obtain a stretchable substrate for next step. The UVO treatment of PDMS surfaces was performed in a commercial UVO cleaner (e.g., Jelight Company, Inc., Model 42A). When treated, the pre-cleaned PDMS films were exposed to UV light of 184.9 and 253.7 nm with a distance of 30 mm from the lamps. Lamps have an output power of 28 mW·cm$^{-2}$ at the distance 6 mm, as reported by the manufacturer. An Ecoflex film was used as a mask for UVO treatment to divide a PDMS film into several regions with different treatment time. For dopamine coating, the solution of dopamine, where the PDMS layer was immersed in, was the dilute aqueous solution of 2 mg dopamine per milliliter of 10 mM tris-HCl with a pH value of 8.5. The immersion time ranged from 1 min to 15 min. Then PDMS substrate was taken out from the solution and blow-dried. When selective coating was needed, an additional PDMS film was used as a mask to cover the selective regions of the PDMS substrate, so as to achieve the PDMS substrate with different regions treated by different time.

EHD Printing System and Process:

The EHD printing system included three sub-systems: a pneumatic dispensing system, a voltage supply system, and a precision three-axis translation stage. Patterns were first created by using CAD software and then converted to the program code for printing. The nozzle with an inner diameter of 150 μm and an outer diameter of 250 μm was selected for EHD printing. The printing voltage was 1500 V, and the back pressure was 0.4 psi. Each substrate used for EHD printing was rested for two hours after treated by different UVO or dopamine treatment procedure. Printing speed varied from 1-10 mm·s$^{-1}$ to achieve different line width for various applications. After printing, the printed Ag NWs patterns were soaked in DI water for 30 seconds to remove PEO, and then dried in an oven at 50° C. This post processing process needs to be repeated several times to remove most of PEO and improve the conductivity of samples. After forming conformal electrodes using liquid metal (Gallium-Indium eutectic, Sigma Aldrich) and copper wires, the PDMS substrate with printed Ag NWs patterns was then sealed with another layer of PDMS and cured to seal the Ag NWs device.

Contact Angle Measurement:

Sessile drop technique was utilized to measure the advancing and receding contact angles of the ink on PDMS substrate with different UVO exposure time (from 5 min to 60 min) or different dopamine coating time (from about 1 min to 60 min). In this work, AgNWs/PEO ink was used as a probe liquid, and a contact angle microscope (e.g., Ramé-hart Instrument Co., Model 200-U1) was used to observe the contact angle of the ink on the substrate at room temperature. The advancing, $\theta_A$, and receding contact angles, $\theta_R$, were measured on both sides of the drop at five different locations for each sample immediately after surface treatment. After a different aging time (about 5-120 min), $\theta_A$ and $\theta_R$ were also measured again at five different locations for each sample to evaluate the hydrophobic stability of the surface treatment.

Sheet Resistance and Thickness Measurement:

To obtain the sheet resistance of each printed line, a typical 4-probe method was used to measure the resistance (R) of these printed lines and $R_s$ was calculated by $R_s=RW/L$ where W and L are the width and measured length (set as 10 mm when tested) of the lines, respectively. The average thickness (t) of the printed lines was measure using Confocal Laser Scanning Microscope (Keyence VKx1100). Based on the measured thickness t, the electrical conductivity a can be calculated by $\sigma=L/(R\times t\times W)$.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A method for printing a one-dimensional (1D) nanomaterial, the method comprising:
    preparing an ink comprising a nanomaterial solution;
    filling a pneumatic dispensing system of a printing device with the ink;
    modifying a surface of a substrate by applying at least one of: a dopamine coating or an ultraviolet ozone treatment;
    printing the 1D nanomaterial on the substrate positioned on a ground electrode, the 1D nanomaterial being printed according to a predefined pattern, and printing of the 1D nanomaterial comprising:
        causing the ink to flow from a printing nozzle of the printing device onto the substrate; and
        applying a voltage between the printing nozzle and the ground electrode causing the ink to form into a cone during the printing.

2. The method of claim 1, wherein the 1D nanomaterial comprises a conductive metal.

3. The method of claim 2, wherein the conductive metal comprises at least one of silver, gold, aluminum, nickel, or copper.

4. The method of claim 1, wherein the nanomaterial solution comprises a mixture of a polymer with a metal concentration.

5. The method of claim 4, wherein the polymer comprises Poly(ethylene oxide).

6. The method of claim 4, wherein the polymer comprises about 4% of the nanomaterial solution.

7. The method of claim 4, further comprising improving the conductivity of the 1D nanomaterial by removing at least a portion of the polymer, wherein removing the at least a portion of the polymer comprises at least one of:
    soaking the printed 1D nanomaterial in a solvent over a period of time and drying the 1D nanomaterial; or
    applying a heat treatment to the printed 1D nanomaterial.

8. The method of claim 1, wherein causing the ink to flow comprises applying a pressure to the ink, an amount of the pressure applied being based at least in part on a viscosity of the ink and a nozzle size of the printing nozzle.

9. The method of claim 1, wherein a printing resolution quality of the 1D nanomaterial is based at least in part on at least one of an applied pressure to the ink, the voltage, a stand-off distance, a printing speed, or a nozzle size.

10. The method of claim 1, wherein the 1D nanomaterial comprises a nanotube, nanorod, nanofiber or a nanowire.

11. A stretchable electronic device comprising a nanomaterial made by the method of claim 1.

12. The stretchable electronic device of claim 11, wherein the nanomaterial solution comprises a mixture of a polymer with a metal concentration.

13. The stretchable electronic device of claim 11, wherein the 1D nanomaterial comprises a conductive metal.

14. A method, comprising:
    modifying a surface of a substrate by applying a dopamine coating or an ultraviolet ozone (UVO) treatment;
    positioning the substrate on top of a ground electrode; and
    printing a nanomaterial component having a predefined pattern on the substrate by:
        causing nanomaterial ink to flow from a printing nozzle of a printing device onto the surface of the substrate; and
        applying a voltage between the printing nozzle and the ground electrode causing the ink to form into a cone during printing.

15. The method of claim 14, wherein the surface of the substrate is modified to enhance a wettability characteristic of the substrate.

16. The method of claim 14, wherein the surface is modified using the UVO treatment, and further comprising treating the surface with the UVO treatment for about thirty minutes.

17. The method of claim 14, wherein the surface is modified using the dopamine coating, and wherein modifying the surface comprises soaking the substrate in the dopamine coating in a range of about eight to about sixty minutes.

18. The method of claim 14, wherein the substrate comprises at least one of paper, glass, polyethylene terephthalate, polydimethylsiloxane (PDMS), polycarbonate filter.

19. The method of claim 14, wherein the nanomaterial ink comprises a mixture of a polymer with a metal concentration comprising at least one of silver, gold, aluminum, nickel, or copper.

20. The method of claim 19, wherein the polymer comprises Poly(ethylene oxide).

* * * * *